United States Patent
Takemura

(10) Patent No.: US 9,294,096 B2
(45) Date of Patent: Mar. 22, 2016

(54) SEMICONDUCTOR DEVICE

(71) Applicant: Semiconductor Energy Laboratory Co., Ltd., Atsugi-shi, Kanagawa-ken (JP)

(72) Inventor: Yasuhiko Takemura, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/632,143

(22) Filed: Feb. 26, 2015

(65) Prior Publication Data

US 2015/0280715 A1    Oct. 1, 2015

(30) Foreign Application Priority Data

Feb. 28, 2014 (JP) ................... 2014-038589
Feb. 28, 2014 (JP) ................... 2014-038592

(51) Int. Cl.
*H03K 19/173* (2006.01)
*H01L 25/00* (2006.01)
*H03K 19/094* (2006.01)
*H01L 29/786* (2006.01)

(52) U.S. Cl.
CPC ...... *H03K 19/09407* (2013.01); *H01L 29/7869* (2013.01)

(58) Field of Classification Search
None
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,172,521 B1 | 1/2001 | Motomura |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Anh Tran
(74) *Attorney, Agent, or Firm* — Fish & Richardson P.C.

(57) ABSTRACT

[Object] A novel programmable logic device is provided.

Figure 1A:
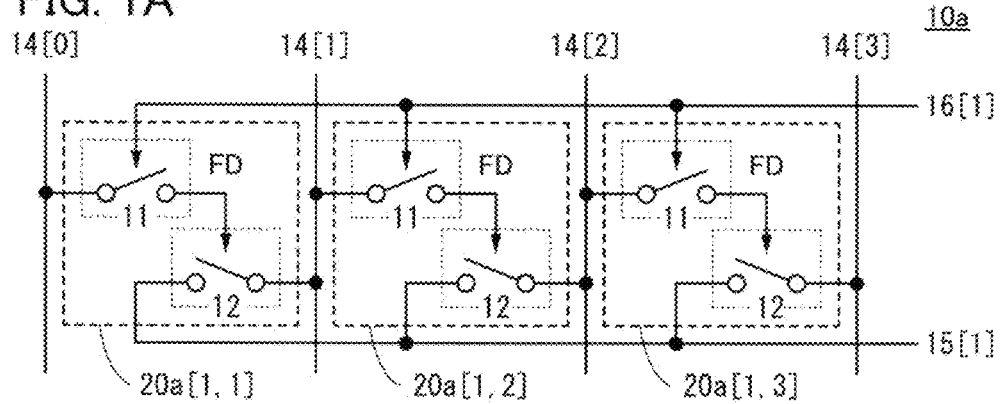

[Solution] Programmable switches each include a first transistor and a second transistor. The first transistor in a first programmable switch controls conduction between a first wiring and a gate of the second transistor in the first programmable switch. The second transistor in the first programmable switch controls conduction between the first wiring and a second wiring. The first transistor in the second programmable switch controls conduction between another first wiring and a gate of the second transistor in the second programmable switch.

14 Claims, 26 Drawing Sheets

(56) References Cited

U.S. PATENT DOCUMENTS

| | | |
|---|---|---|
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,547,753 B2 | 10/2013 | Takemura et al. |
| 8,634,228 B2 | 1/2014 | Matsuzaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006878 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2013/0314124 A1* | 11/2013 | Ikeda et al. ............... 326/41 |
| 2014/0176185 A1* | 6/2014 | Kurokawa ............... 326/38 |
| 2014/0285235 A1 | 9/2014 | Kurokawa |
| 2015/0091629 A1 | 4/2015 | Ishizu et al. |
| 2015/0131356 A1 | 5/2015 | Kurokawa |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sept. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZNO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID

(56) References Cited

OTHER PUBLICATIONS

Digest '09 : SID International Symposium Digest of Technical Papers, May 31, 2009, pp. 1110-1112.
Godo.H et al., "Temperature Dependence of Characteristics and Electronic Structure For Amorphous In—Ga—Zn—Oxide TFT". AM-FPD '09 Digest of Technical Papers, Jul. 1, 2009, pp. 41-44.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Hirao.T et al., "Novel Top-Gate Zinc Oxide Thin-Film Transistors (ZNO TFTs) for AMLCDs", J. Soc. Inf. Display (Journal of the Society for Information Display), 2007, vol. 15, NO. 1, pp. 17-22.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Janotti.A et al., "Native Point Defects in ZnO", Phys. Rev. B (Physical Review. B), Oct. 4, 2007, vol. 76, No. 16, pp. 165202-1-165202-22.
Janotti.A et al., "Oxygen Vacancies in ZnO", Appl. Phys. Lett. (Applied Physics Letters), 2005, vol. 87, pp. 122102-1-122102-3.
Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kim.S et al., "High-Performance oxide thin film transistors passivated by various gas plasmas", 214th ECS Meeting, 2008, No. 2317, ECS.
Kimizuka.N. et al., "Spinel,YBFE2O4, and YB2FE3O7 Types of Structures for Compounds in the IN2O3 and SC2O3—A2O3—BO Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.
Kimizuka.N. et al., "Syntheses and Single-Crystal Data of Homologous Compounds, In2O3(ZnO)m (m=3, 4, and 5), InGaO3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits, 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED ", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "SUFTLA Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Nomura.K et al., "Carrier transport in transparent oxide semiconductor with intrinsic structural randomness probed using single-crystalline InGaO3)ZnO)5 films", Appl. Phys. Lett. (Applied Physics Letters) , Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.
Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

(56) References Cited

OTHER PUBLICATIONS

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM. 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar PLASMA Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

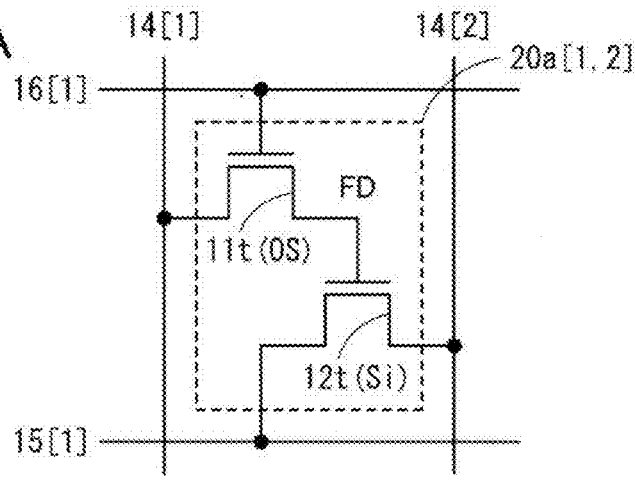
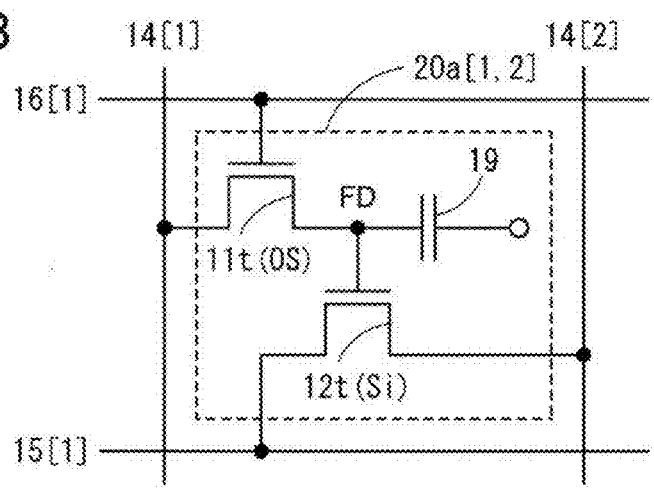
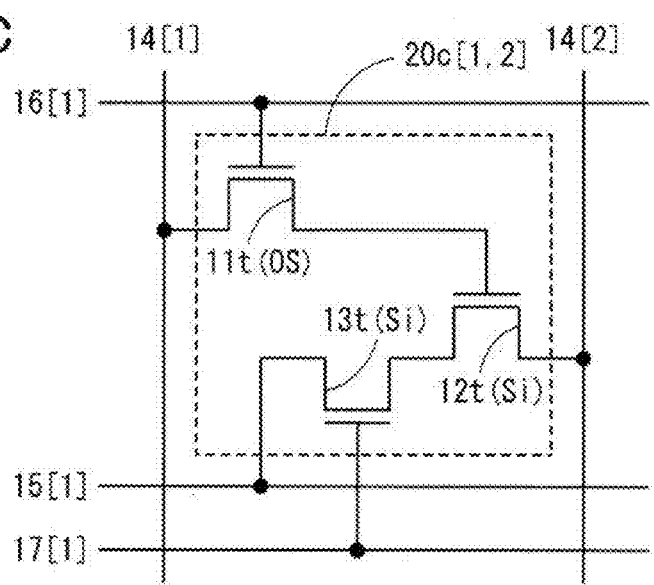

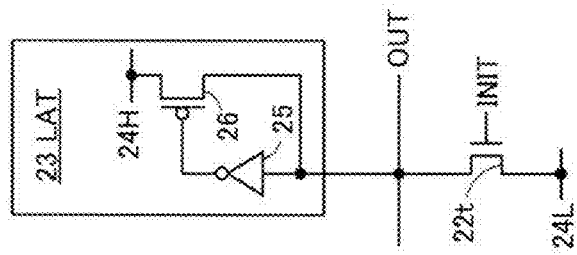
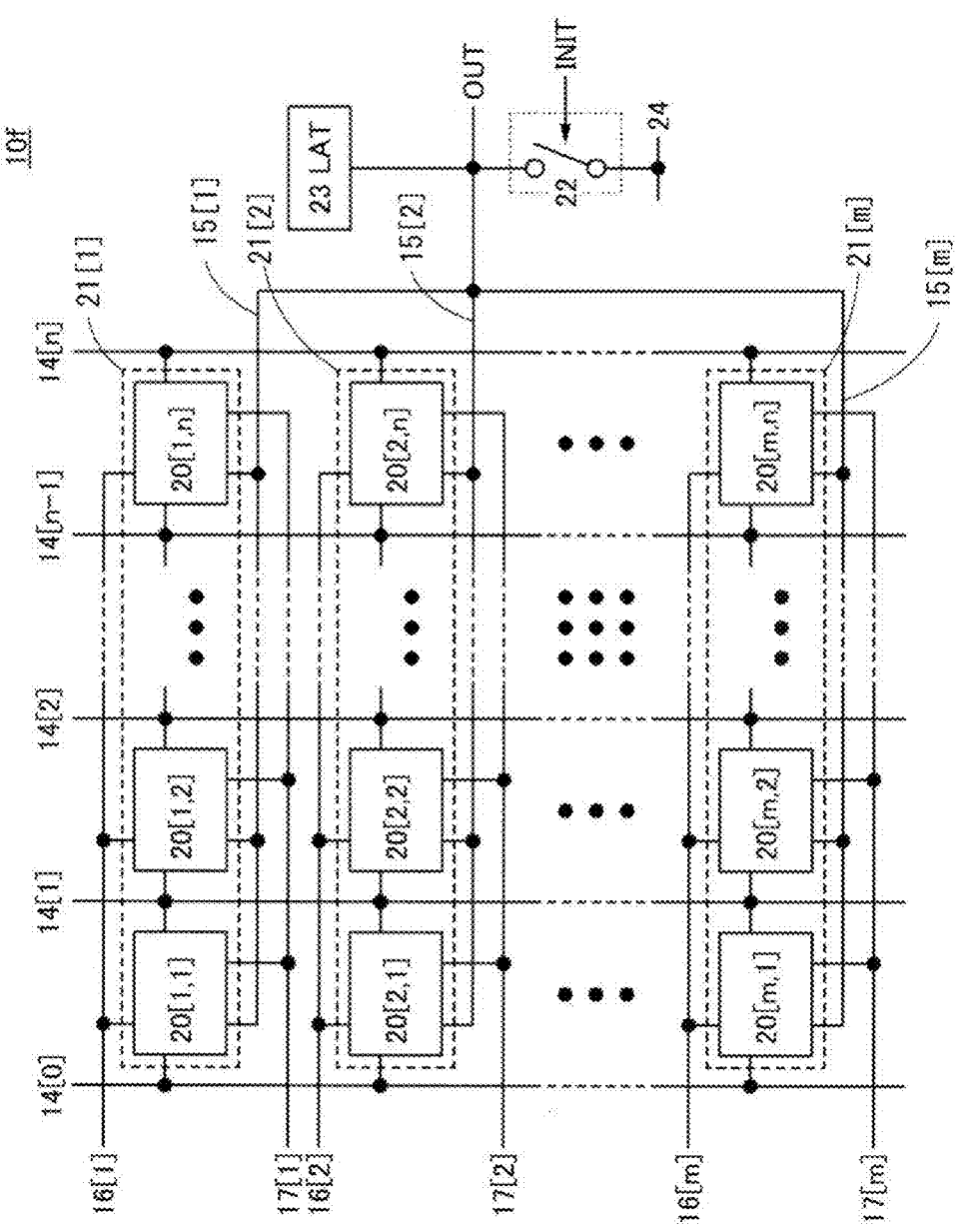

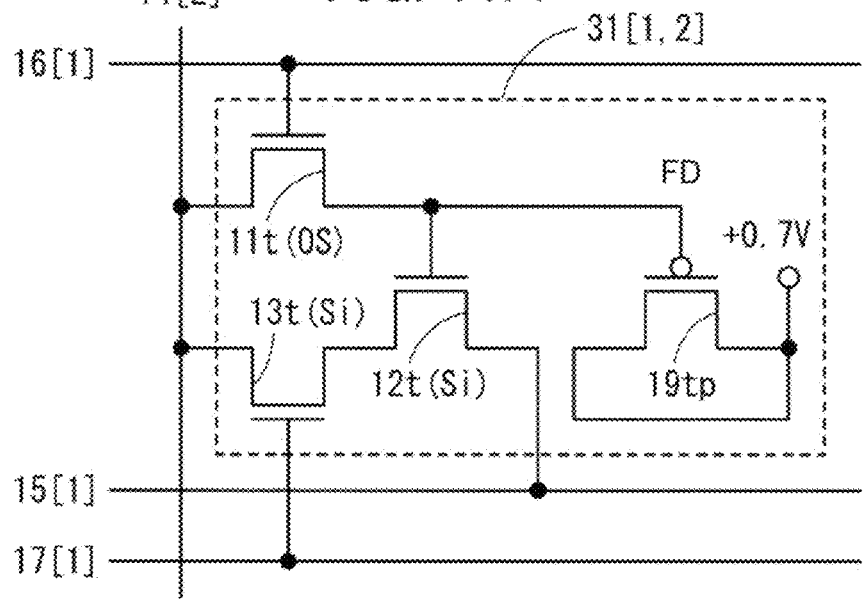
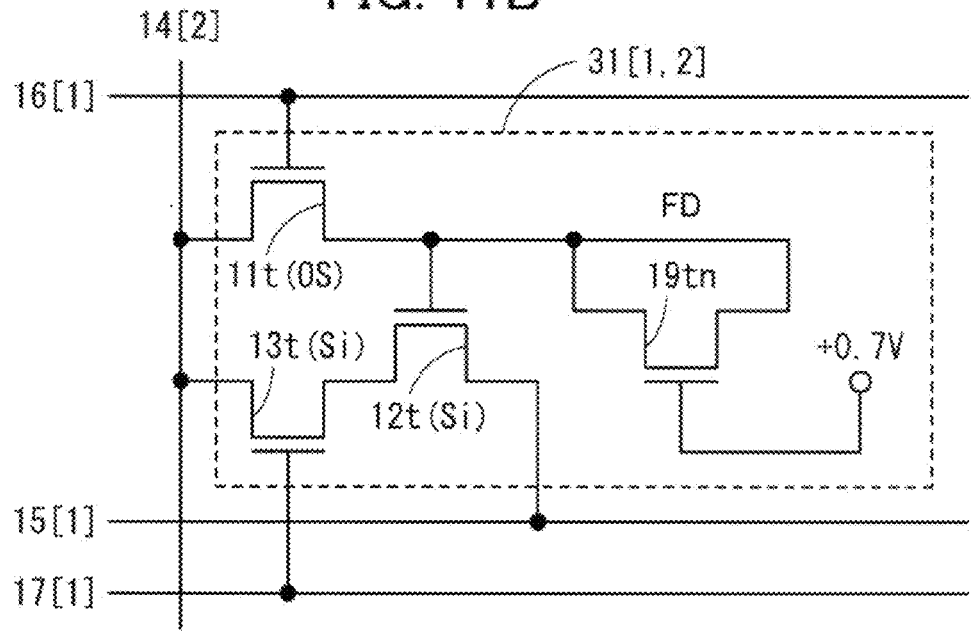

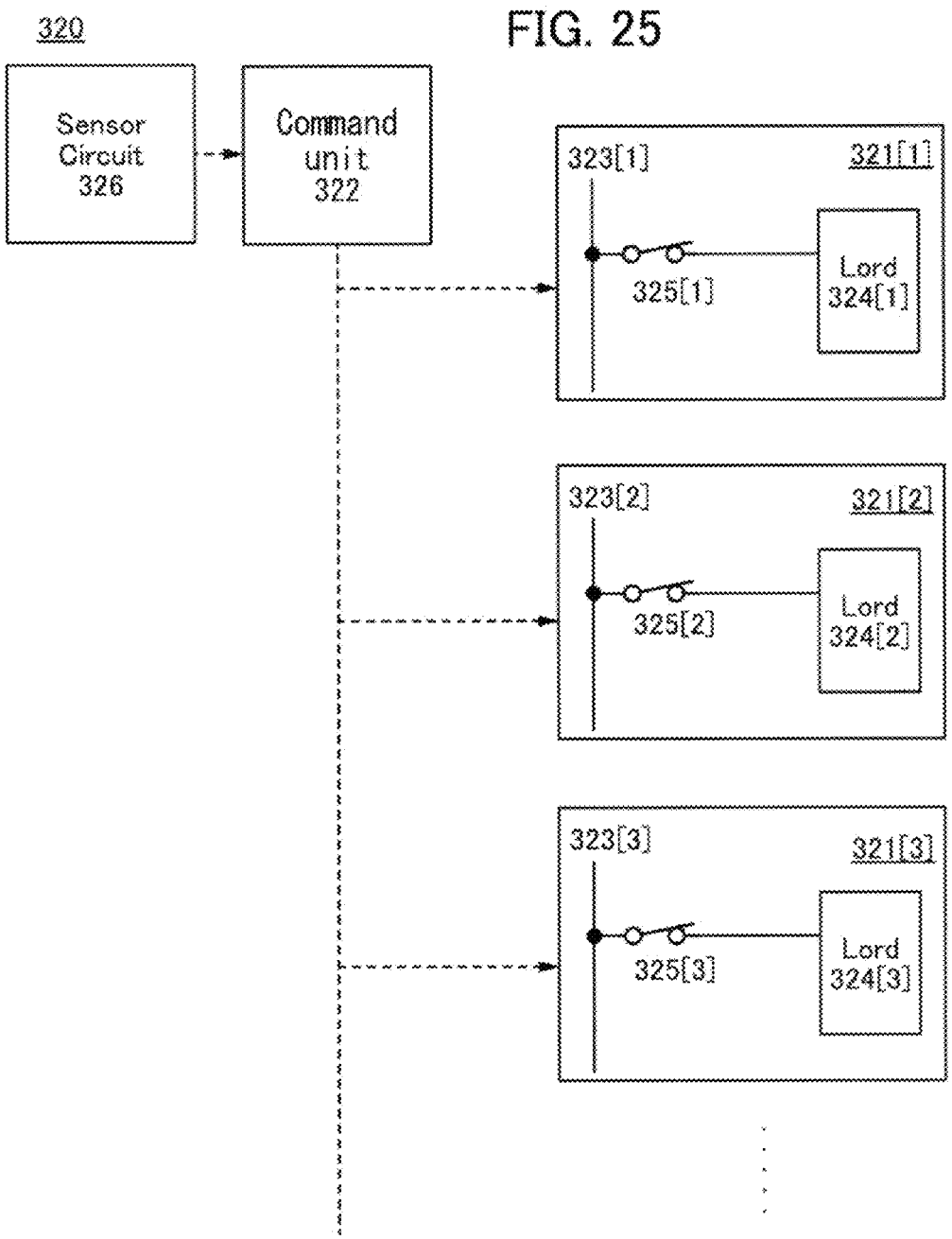

SEMICONDUCTOR DEVICE

The present disclosure relates to a semiconductor device and the technique related to the semiconductor device.

In a programmable logic device (PLD), a logic circuit is formed using adequate-scale programmable logic elements (PLE), and the PLD is characterized in that the function of each PLE and electrical connection between the PLEs can be changed after manufacture (see Patent Document 1). Specifically, the PLD includes a plurality of PLEs and a routing resource for controlling electrical connection between the PLEs. The PLEs and the routing resource each include a memory. In the memory, circuit data (configuration data) for defining the function of each PLE and the electrical connection between the PLEs, which is made with the routing resource, is stored.

A memory for storing configuration data is referred to as a configuration memory. Storing configuration data in a configuration memory is referred to as configuration. In particular, rewriting the configuration memory with another configuration data is referred to as reconfiguration.

Patent Document 2 discloses a programmable LSI which stores configuration data sent from a DRAM in a configuration memory composed of an SRAM to perform reconfiguration in a short time.

[Patent Document]
 [Patent Document 1] U.S. Pat. No. 8,547,753
 [Patent Document 2] U.S. Pat. No. 6,172,521

A novel programmable logic device and the technique related thereto are provided. For example, a semiconductor device capable of preventing a flow of a large current between wirings, a semiconductor device capable of reducing the occurrence of breakage, a semiconductor device capable of reducing a flow of a flow-through current, a semiconductor device with a low off-state current, a semiconductor device with small power consumption, an eye-friendly display device, a semiconductor device that uses a transparent semiconductor layer, a semiconductor device that uses a highly reliable semiconductor layer, a novel semiconductor device, or the like is provided.

Means for Solving the Problems

Disclosed is a semiconductor device characterized by including a first wiring, a second wiring, a third wiring, a fourth wiring, a first switch, a second switch, a third switch, and a fourth switch. The first switch has a function of controlling conduction between the first wiring and a control terminal of the second switch, the second switch has a function of controlling conduction between the second wiring and the fourth wiring, the third switch has a function of controlling conduction between the second wiring and a control terminal of the fourth switch, and the fourth switch has a function of controlling conduction between the third wiring and the fourth wiring. A first signal is supplied to the first wiring and the second wiring in a first period, a second signal is supplied to the second wiring and the third wiring in a second period, and the third wiring and the fourth wiring are held at a constant potential determined independent of the first signal in the first period. The first switch and the third switch are in an on state in the first period, and the first switch and the third switch are in an off state in the second period. However, without being limited to this, the one disclosed below is acceptable.

With the above-described structure, for example, a programmable logic device capable of reducing the layout area is provided. Furthermore, a downsized semiconductor device is provided. However, without being limited to these, the effects described below in detail may be provided.

Figure 1B:
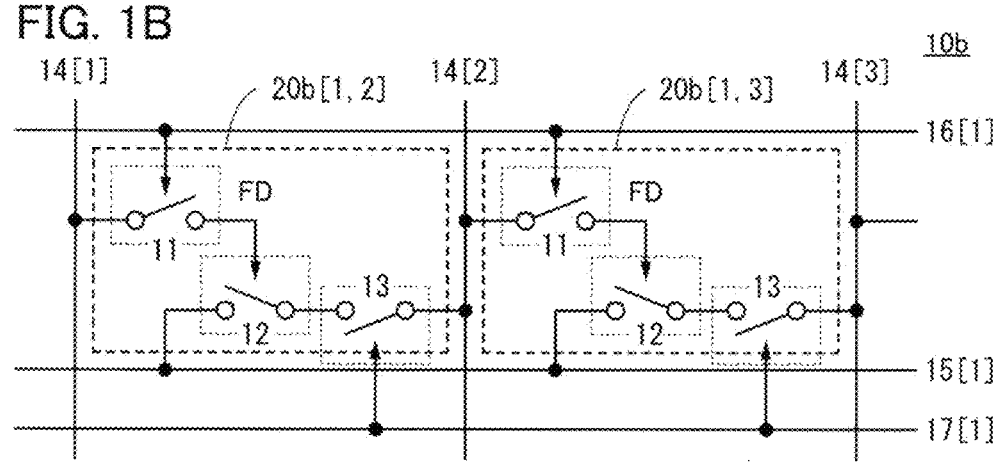
Figure 1C:
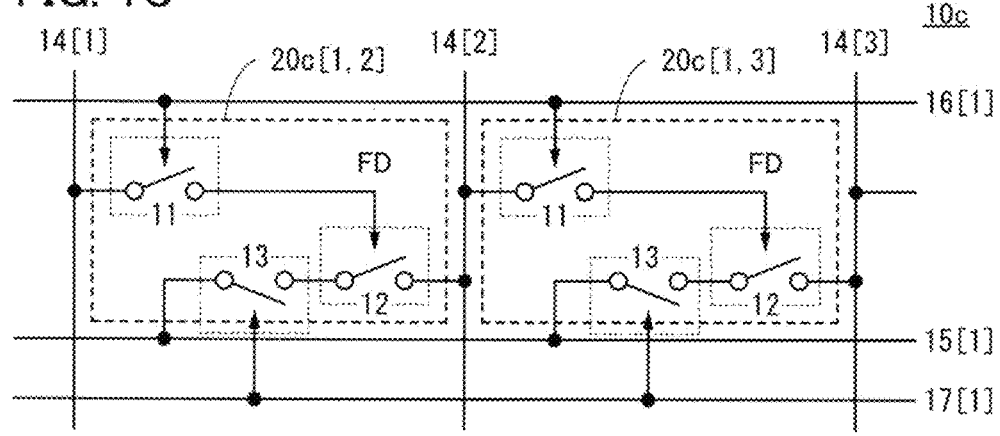
Figure 2A:
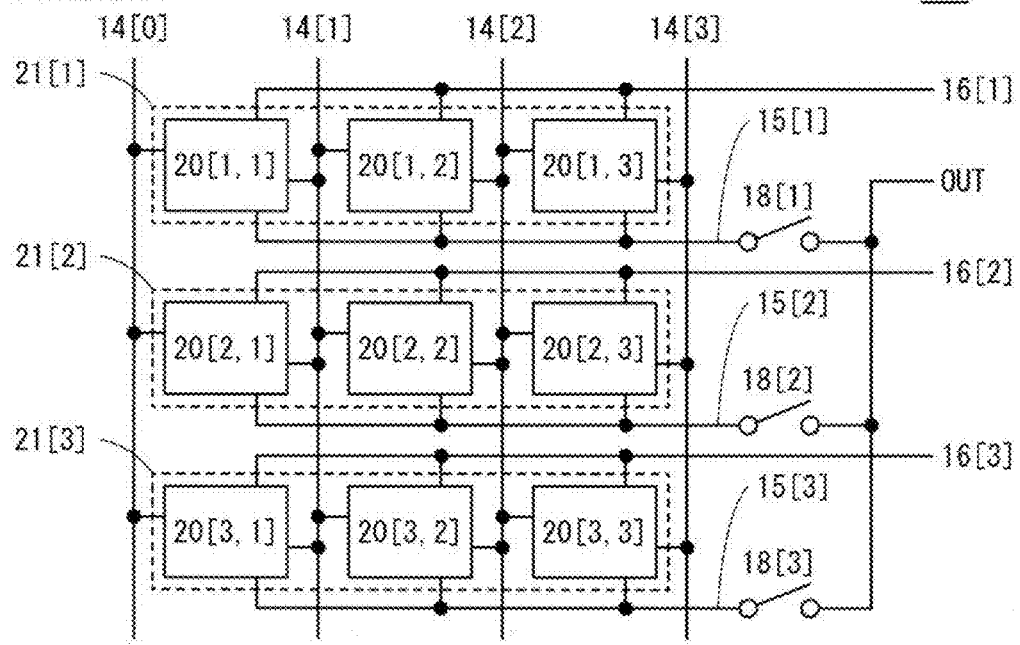
Figure 2B:
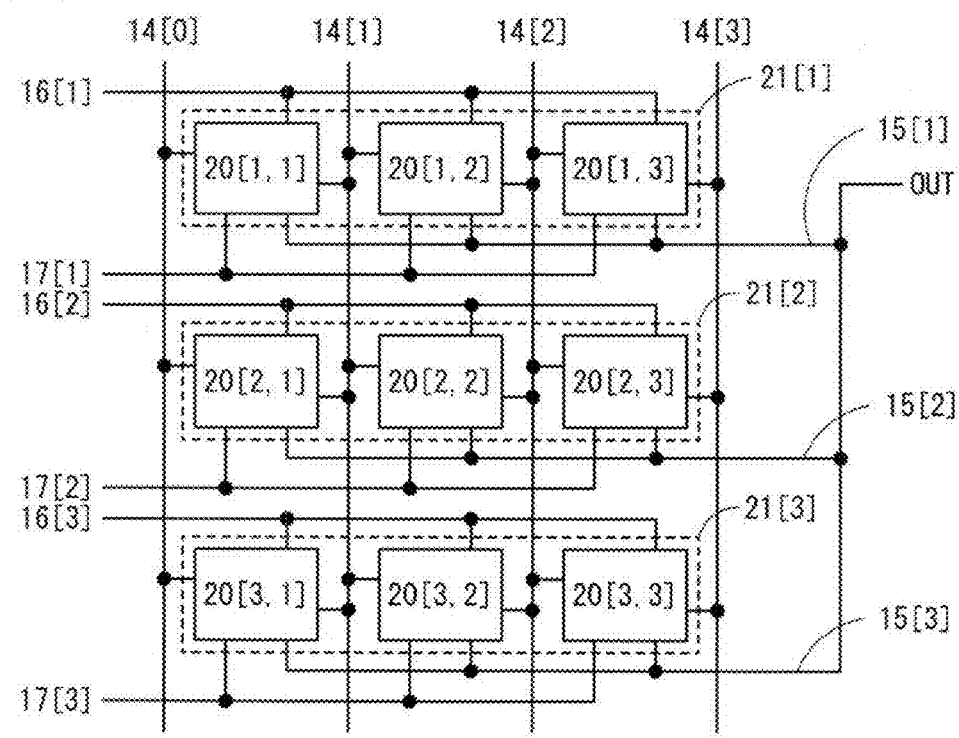
Figure 4A:
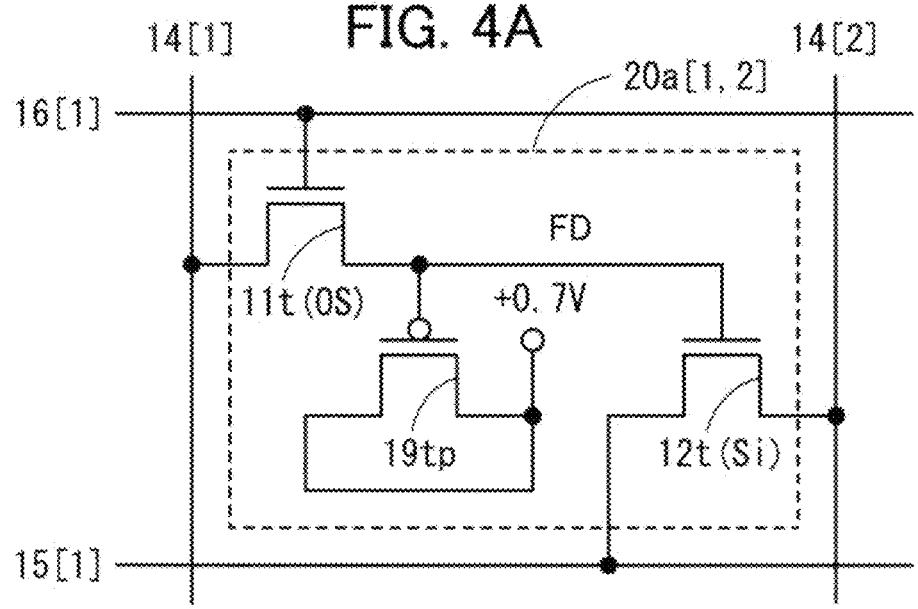
Figure 4B:
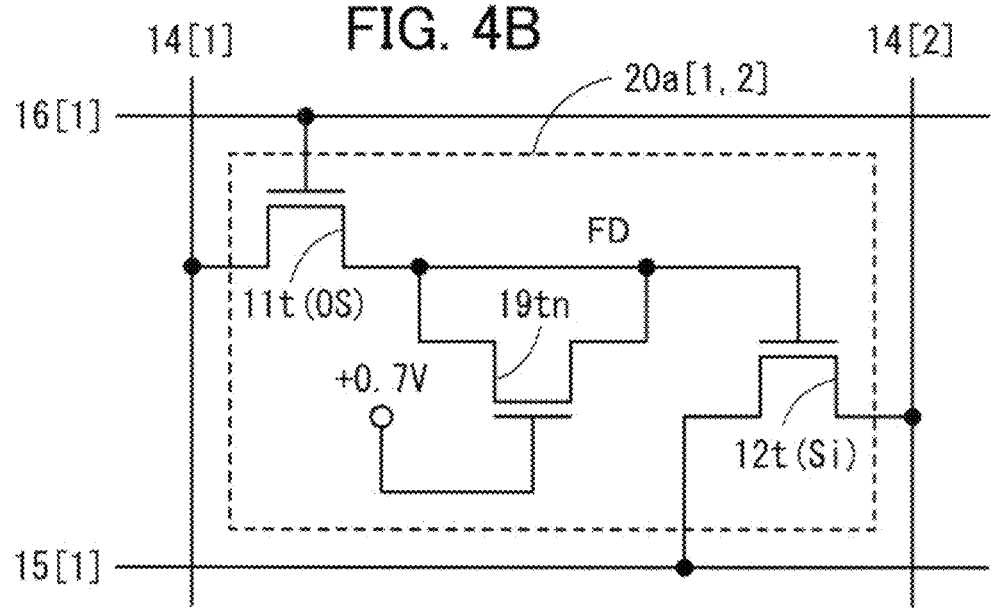
Figure 5:
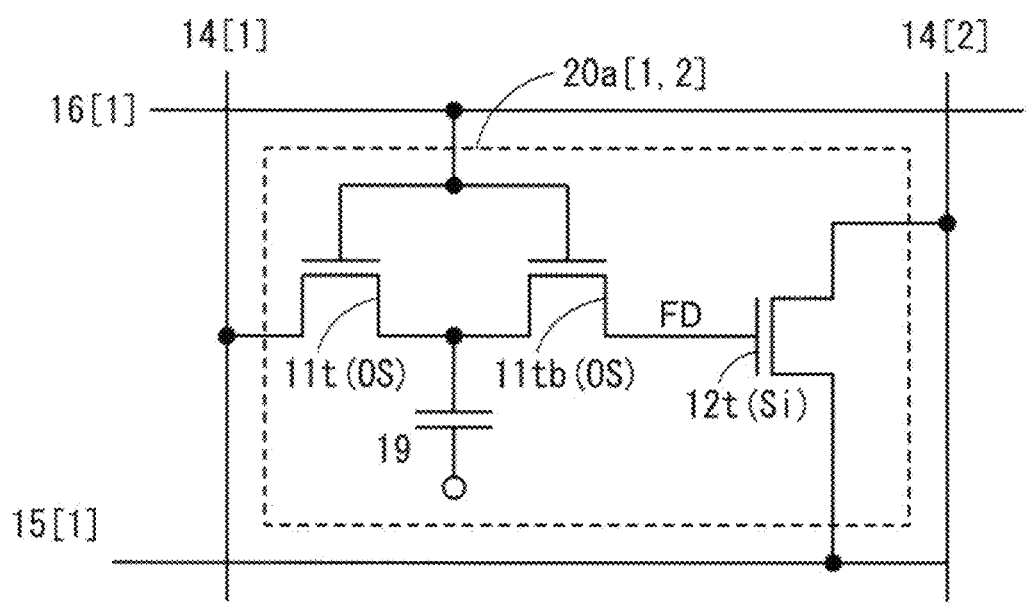
Figure 7:
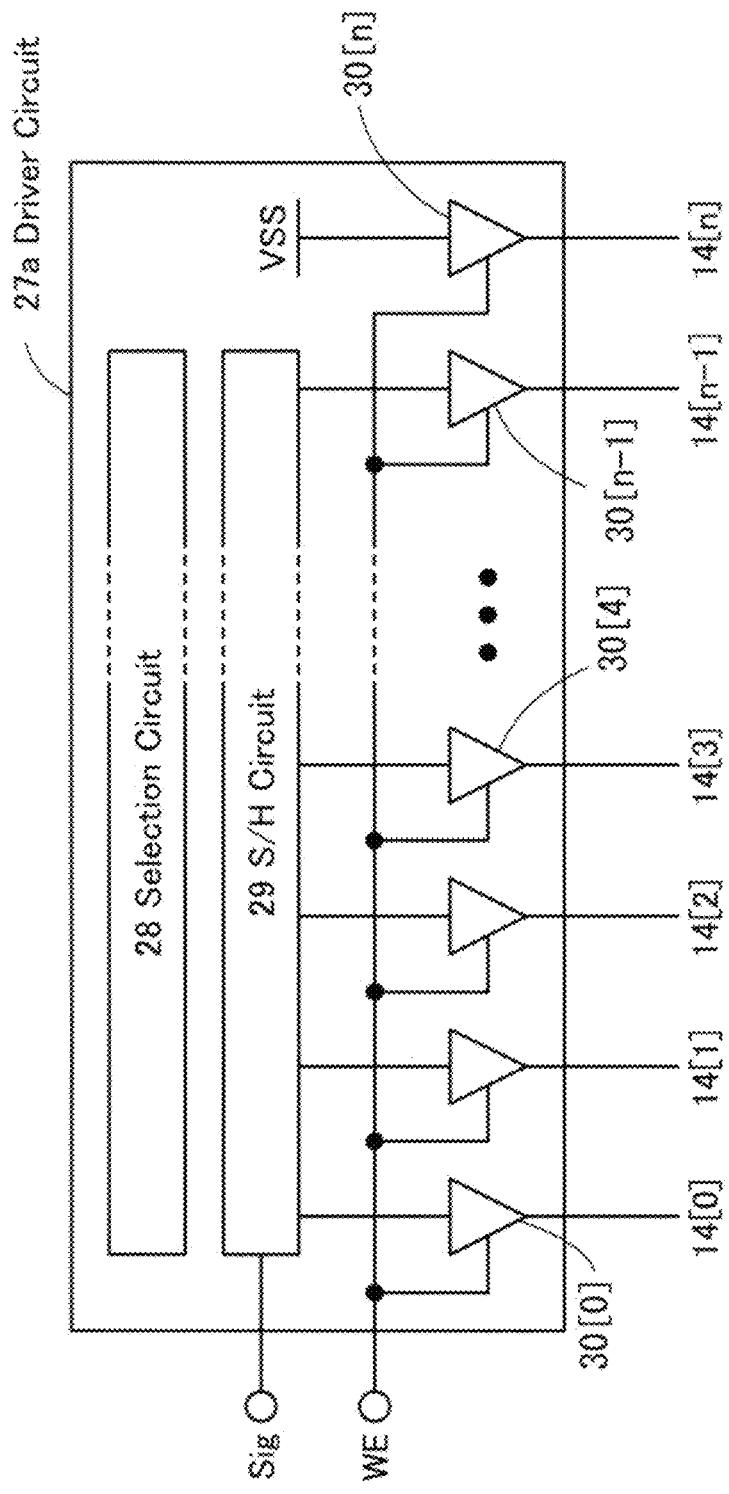
Figure 8A:
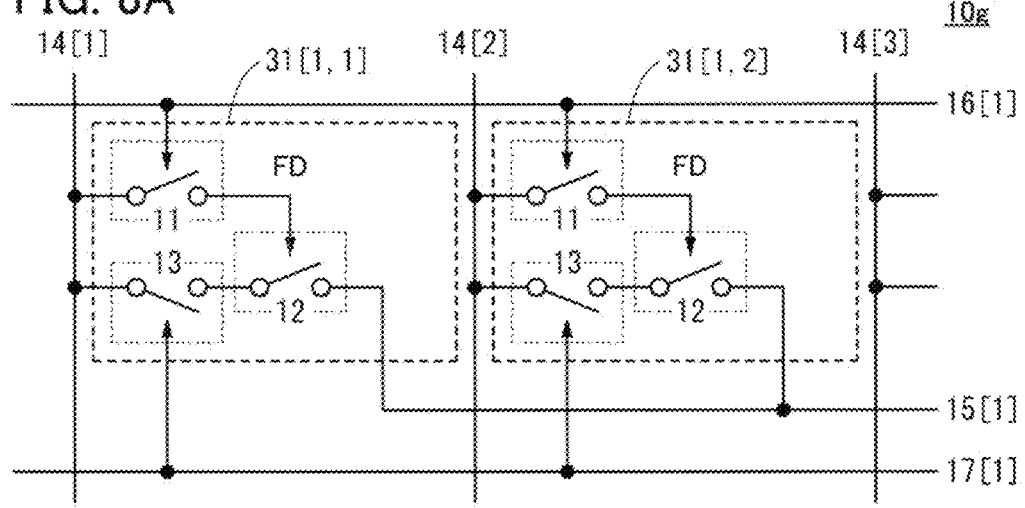
Figure 8B:
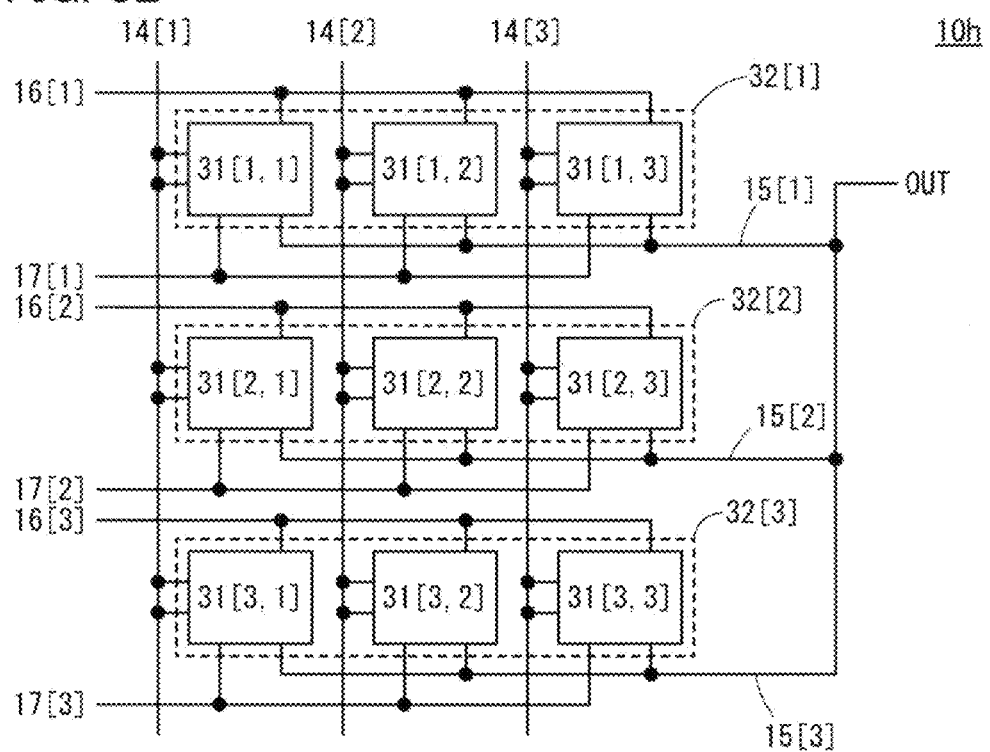
Figure 9A:
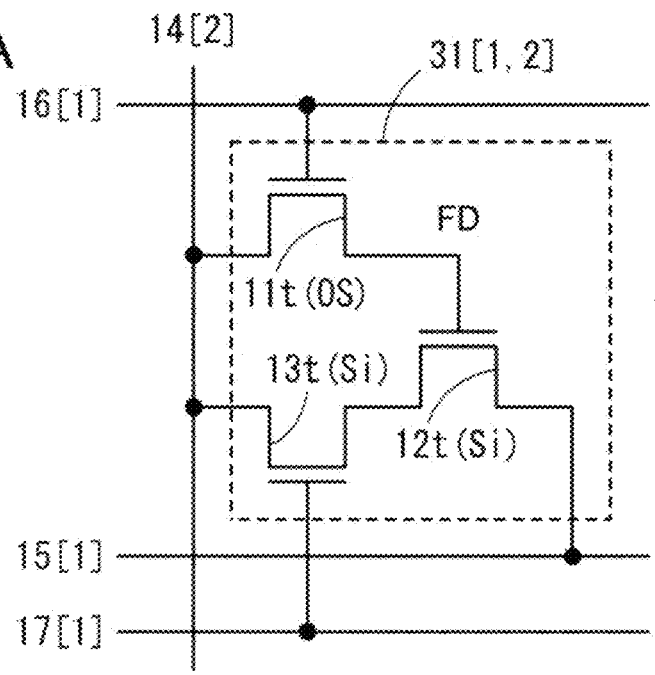
Figure 9B:
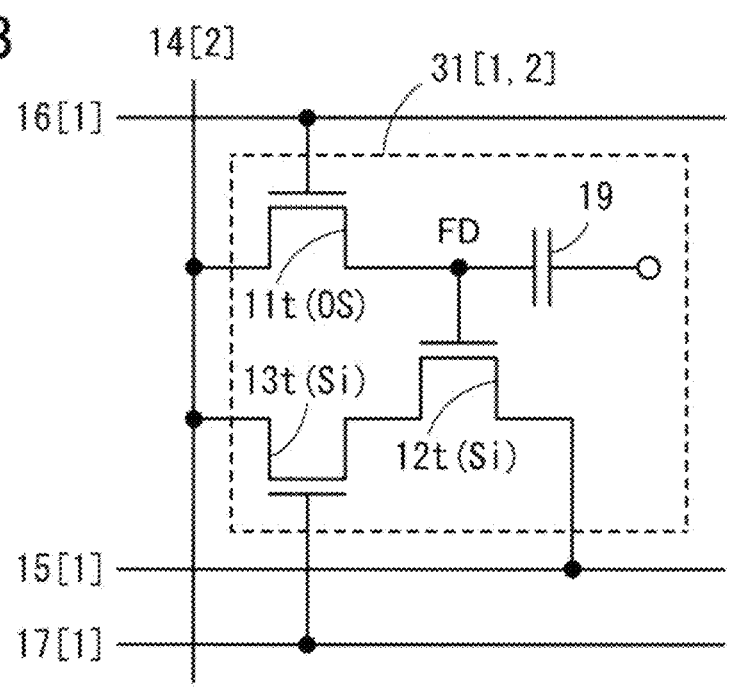
Figure 10:
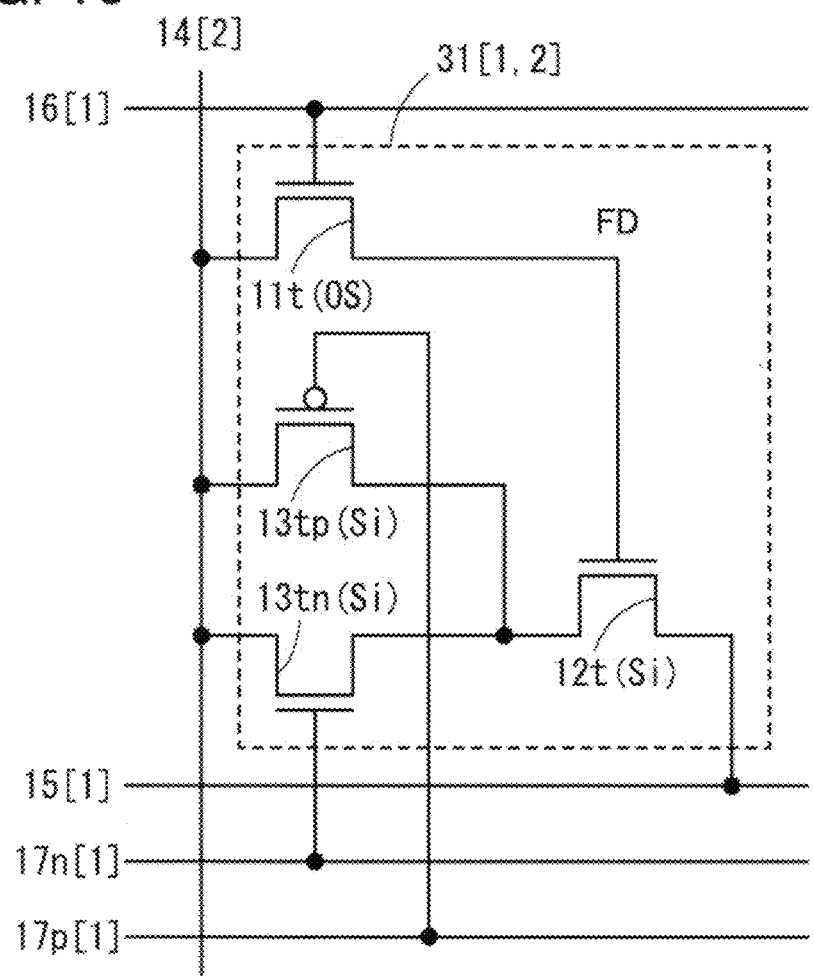
Figure 12:
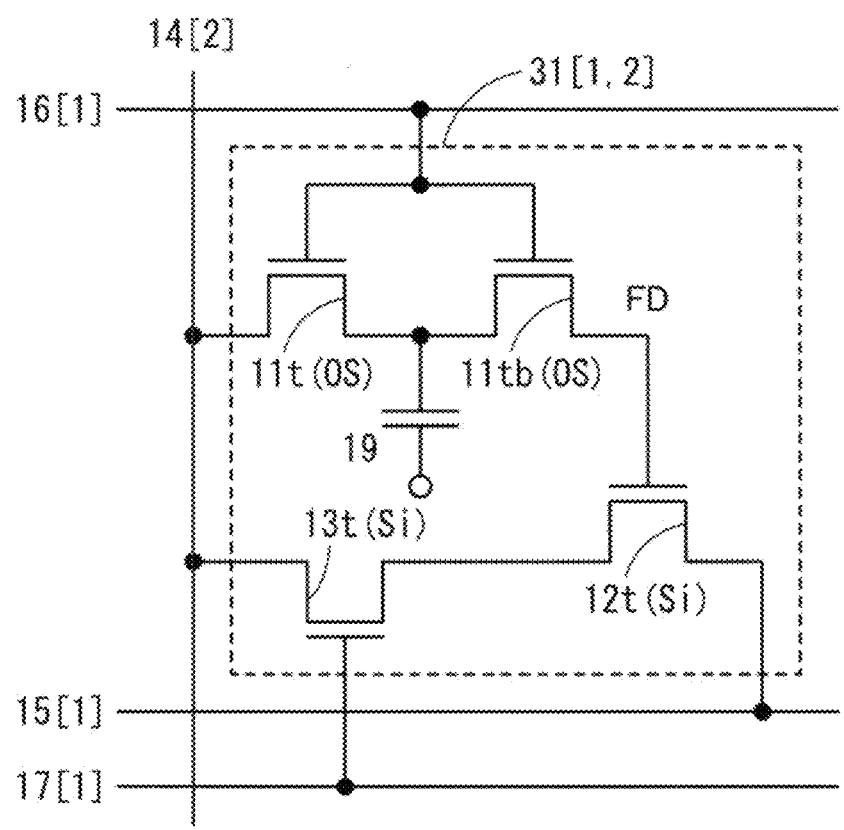
Figure 13:
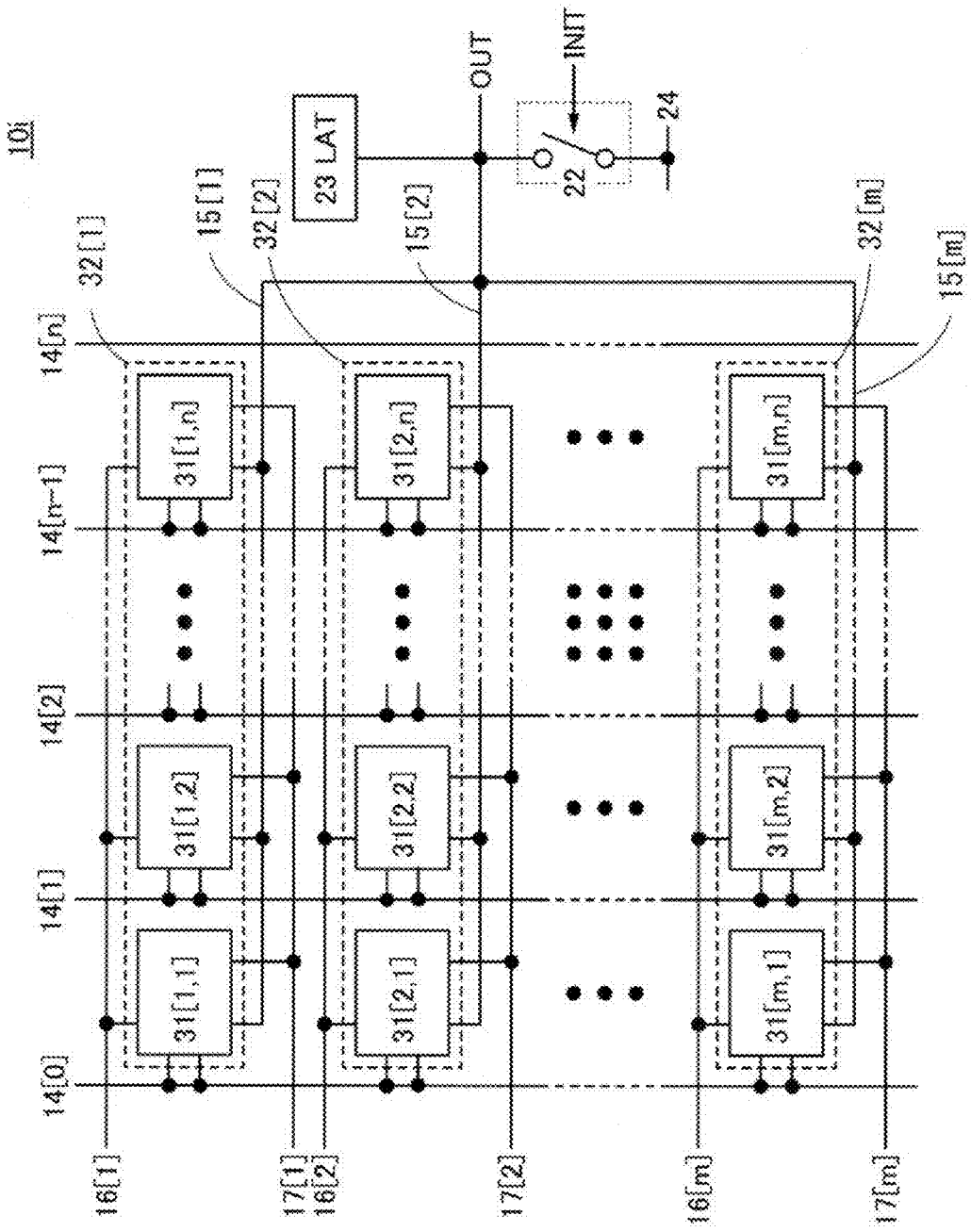
Figure 14:
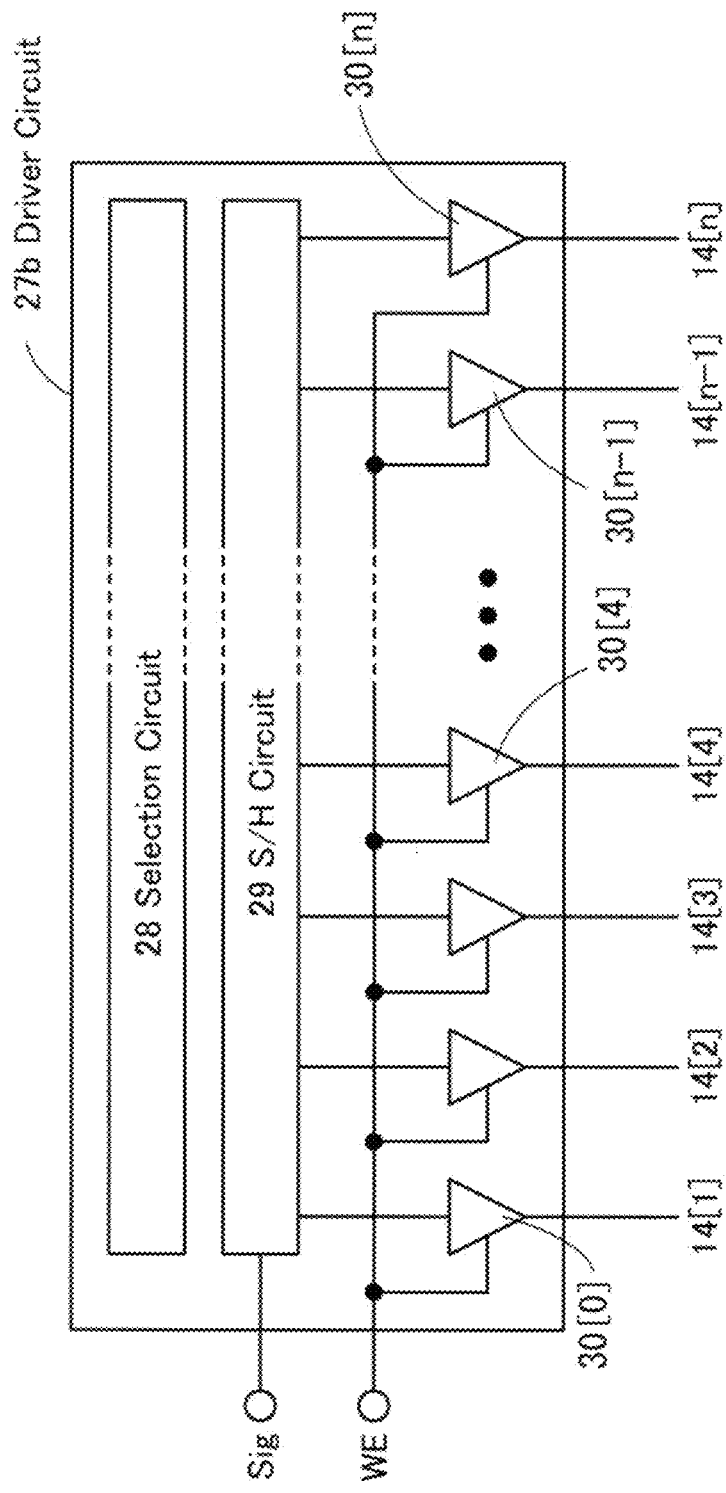
Figure 15A:
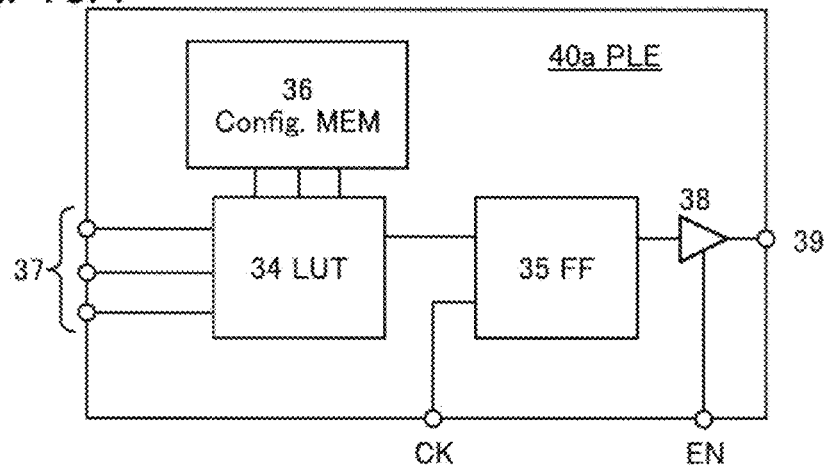
Figure 15B:
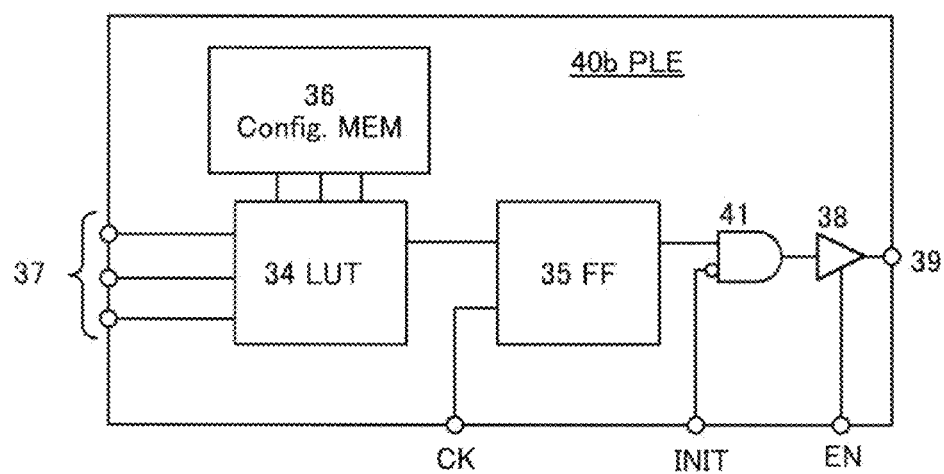
Figure 15C:
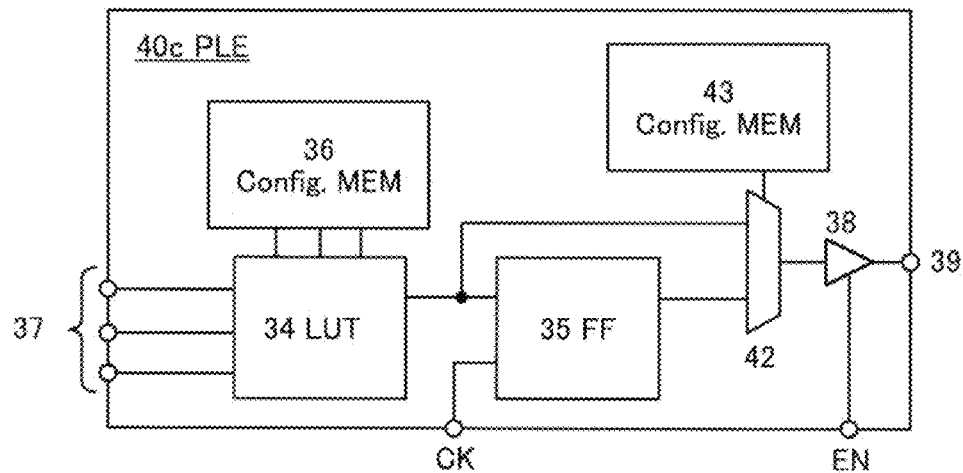
Figure 16:
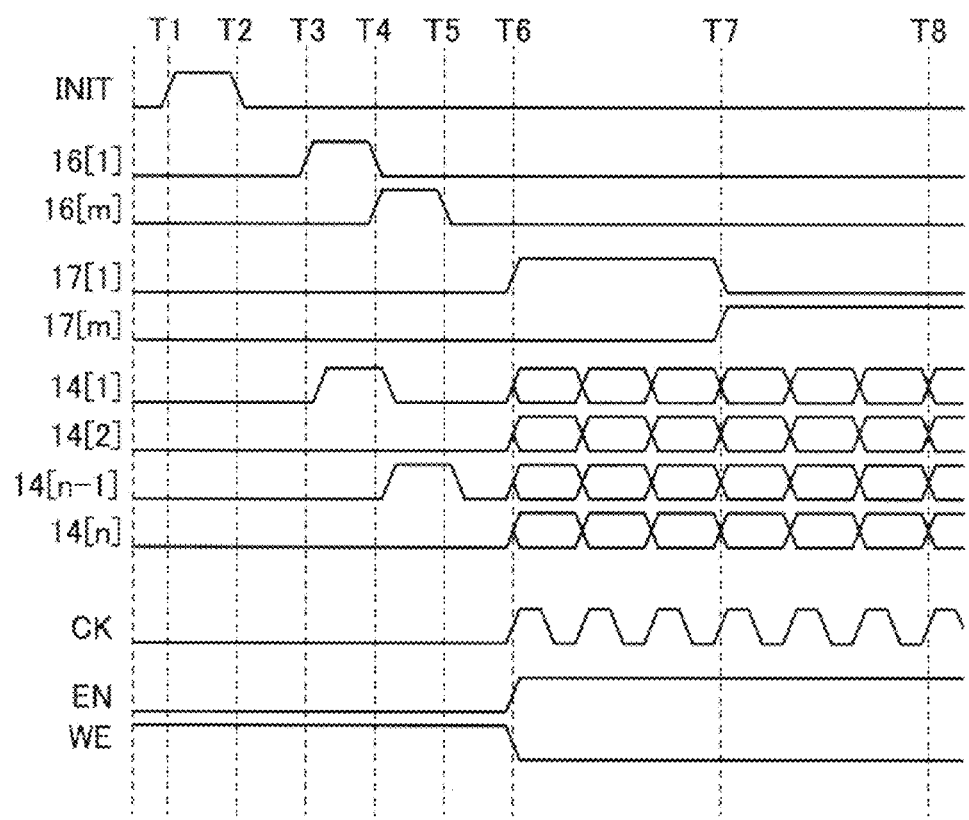
Figure 17A:
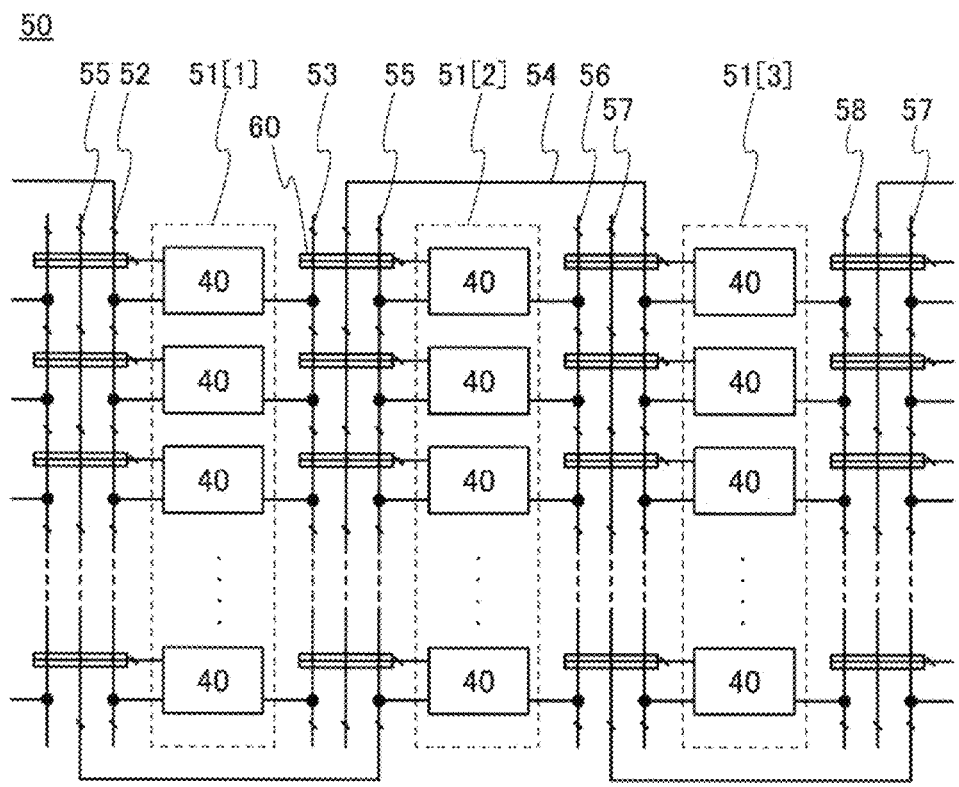
Figure 17B:
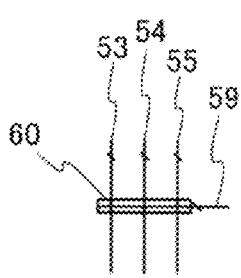
Figure 17C:
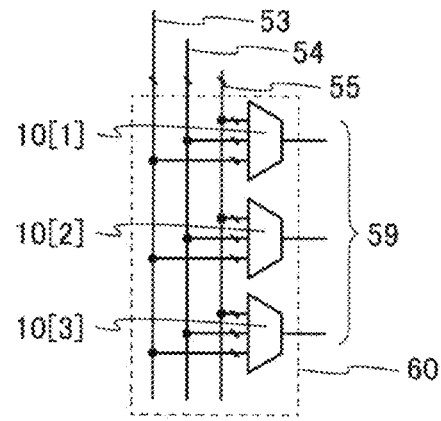
Figure 18:
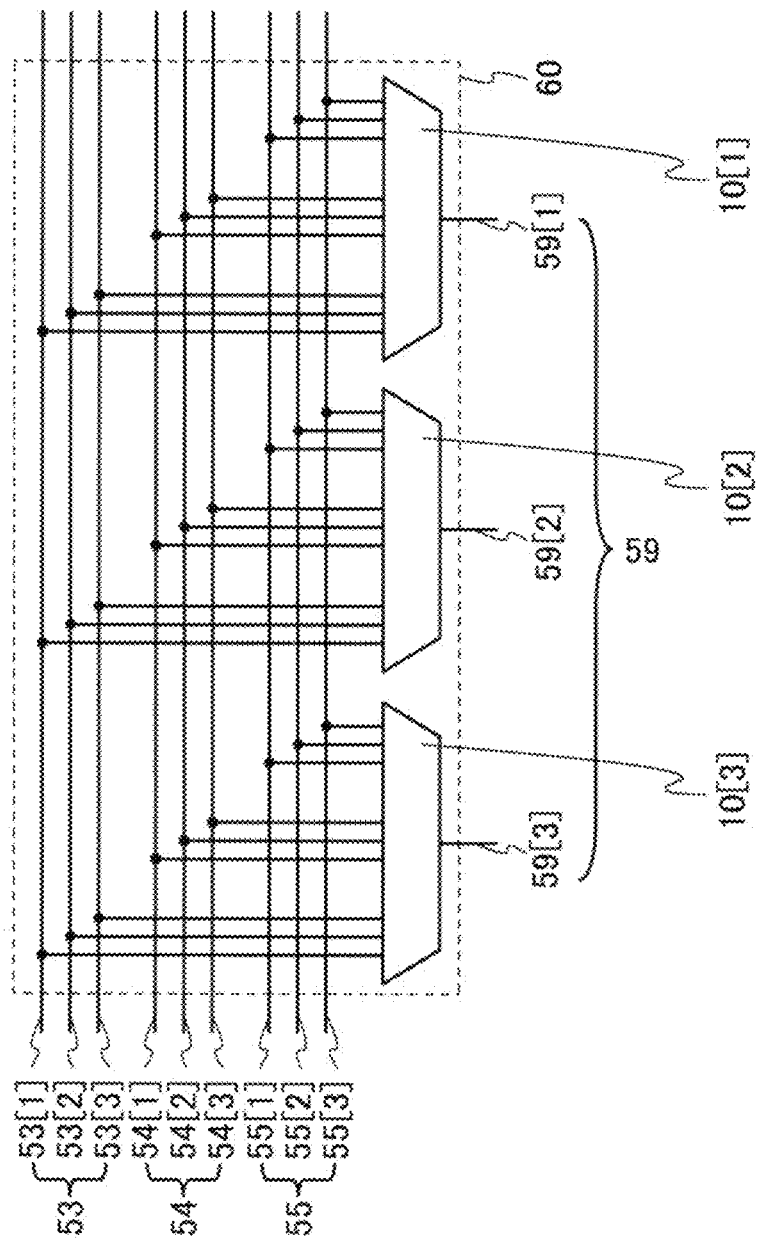
Figure 19:
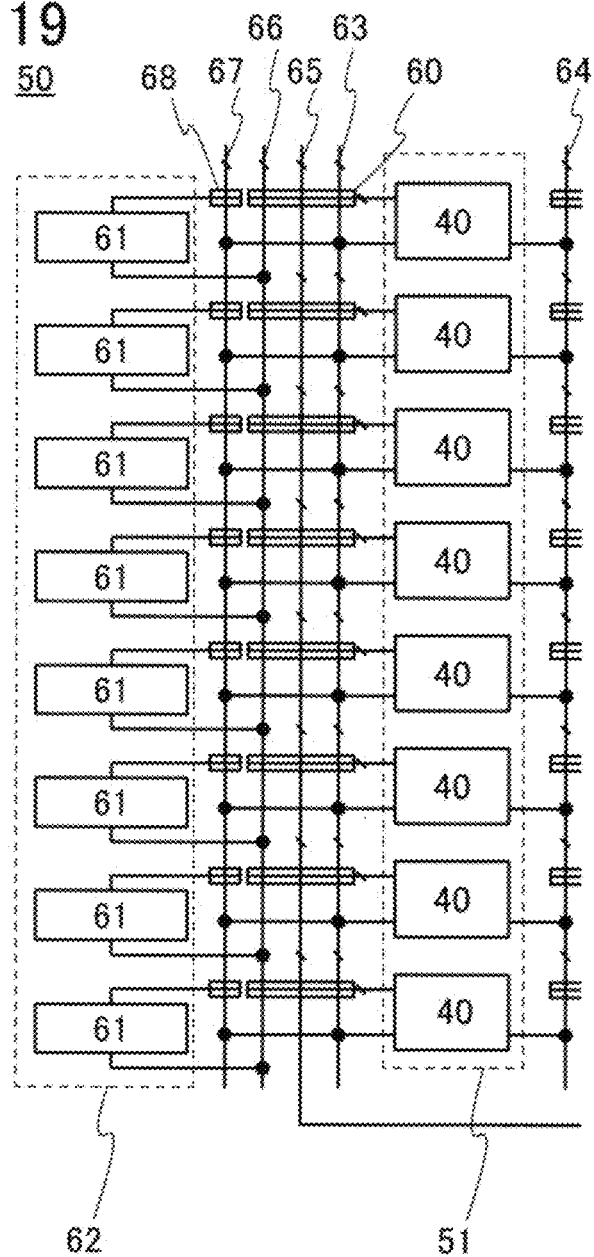
Figure 20:
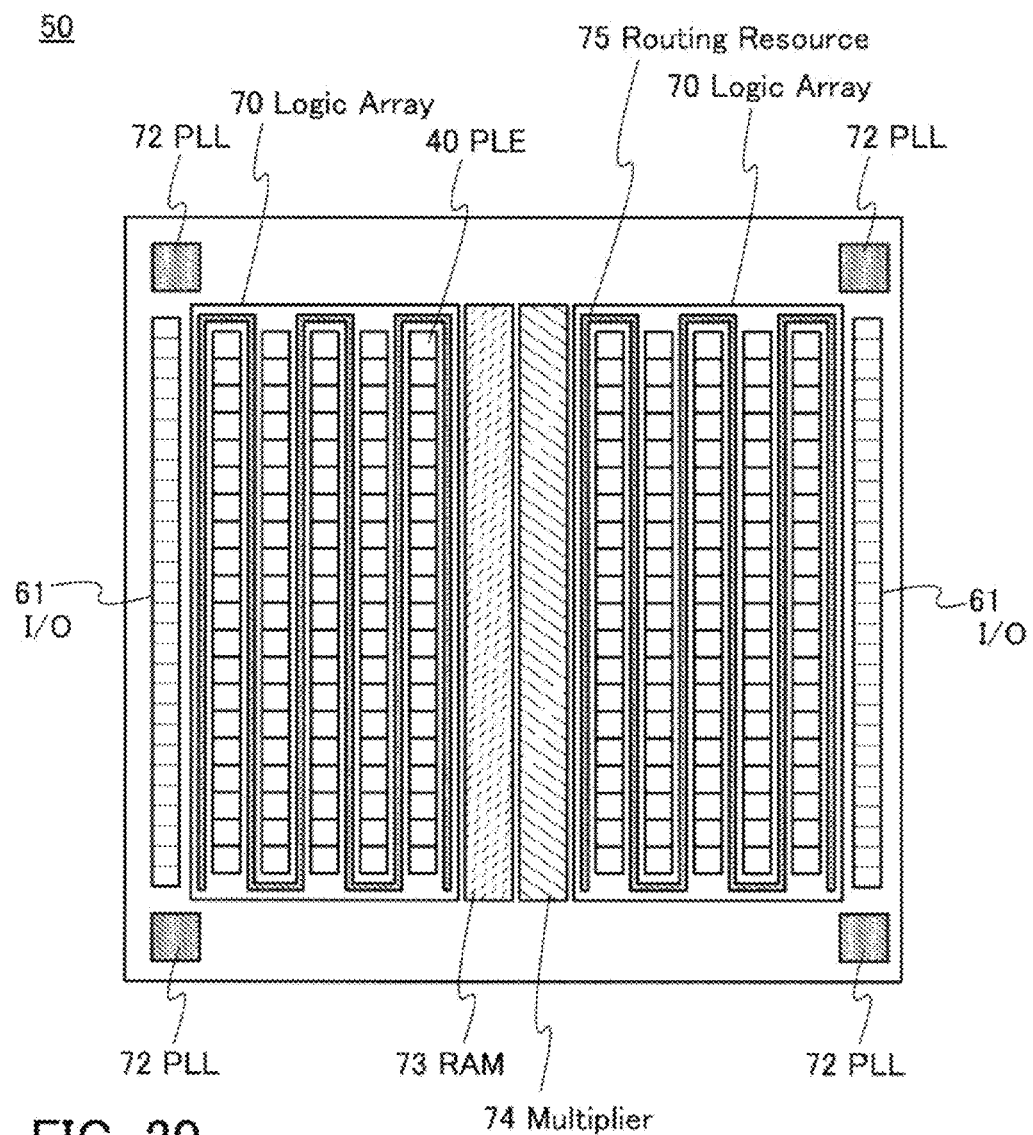
Figure 21A:
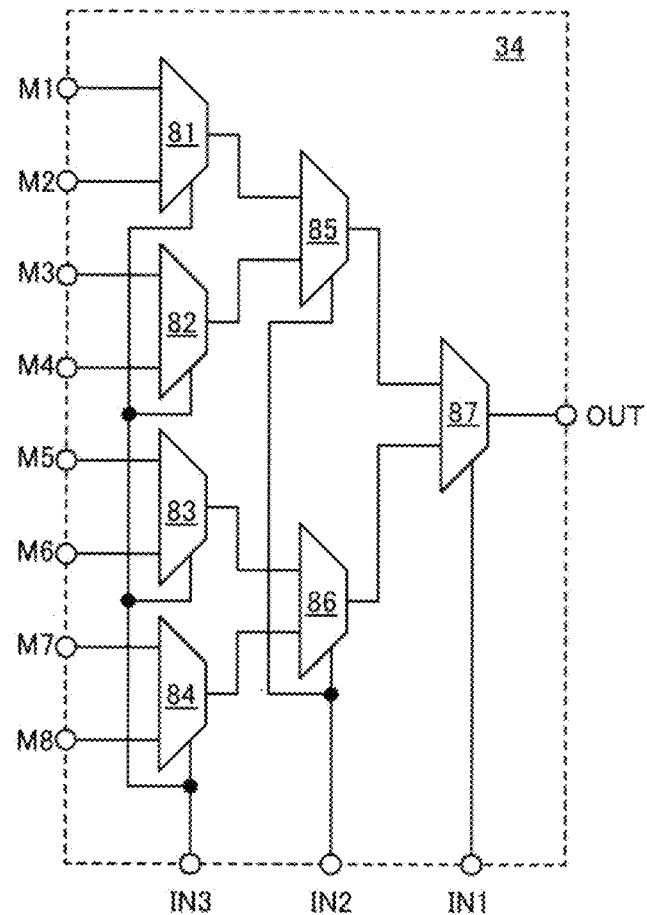
Figure 21B:
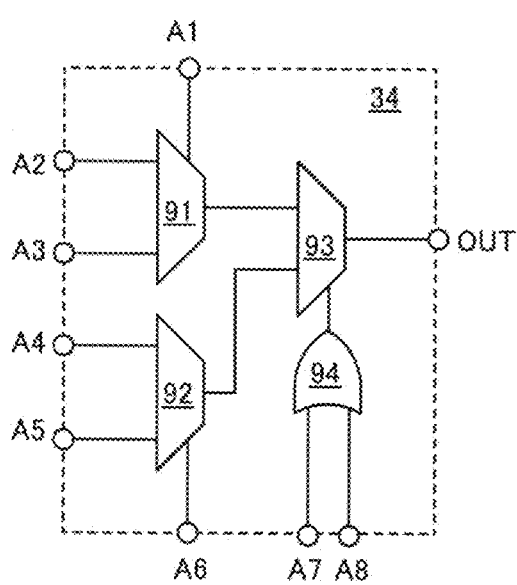
Figure 21C:
Figure 22:
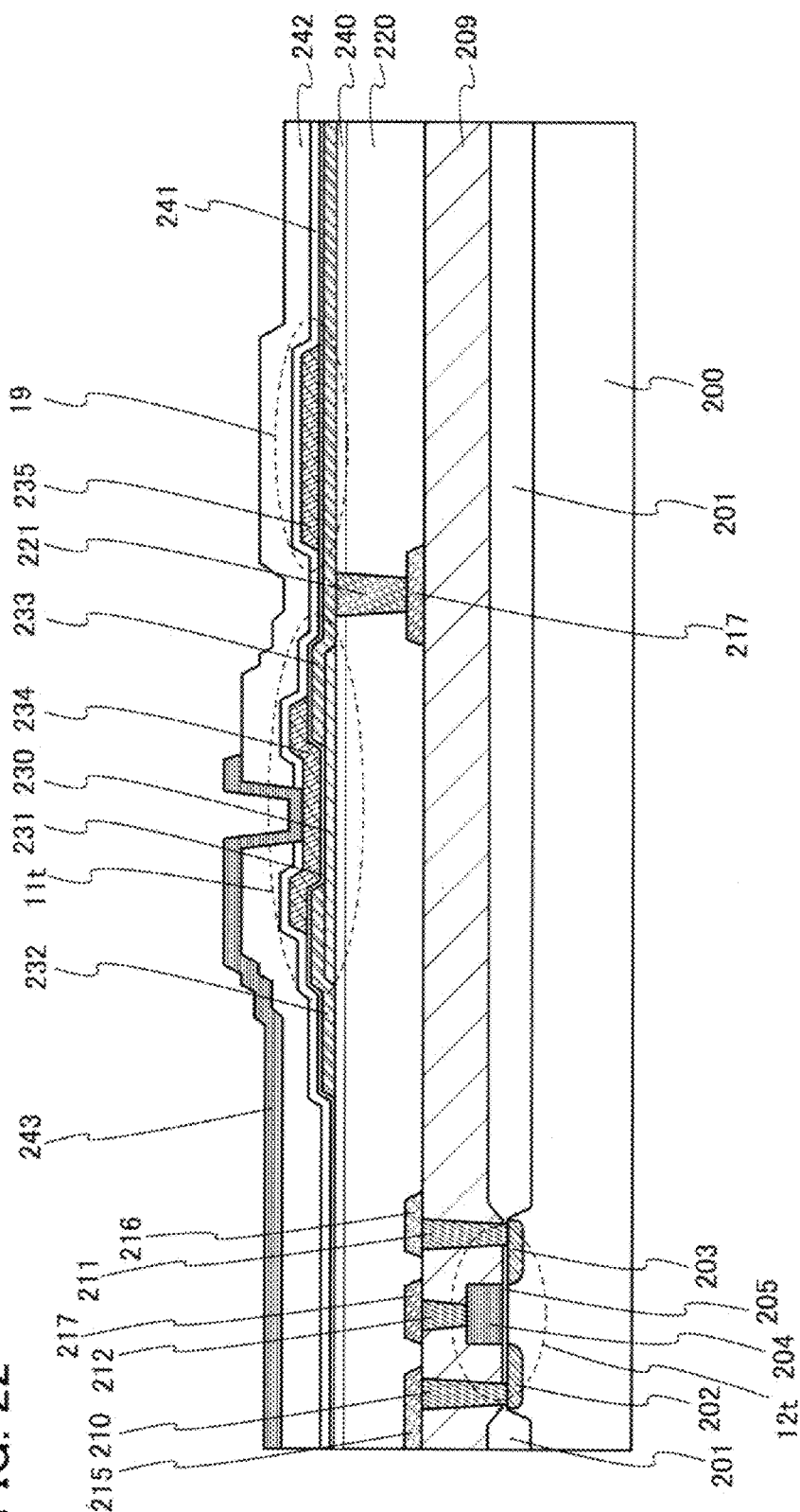
Figure 23:
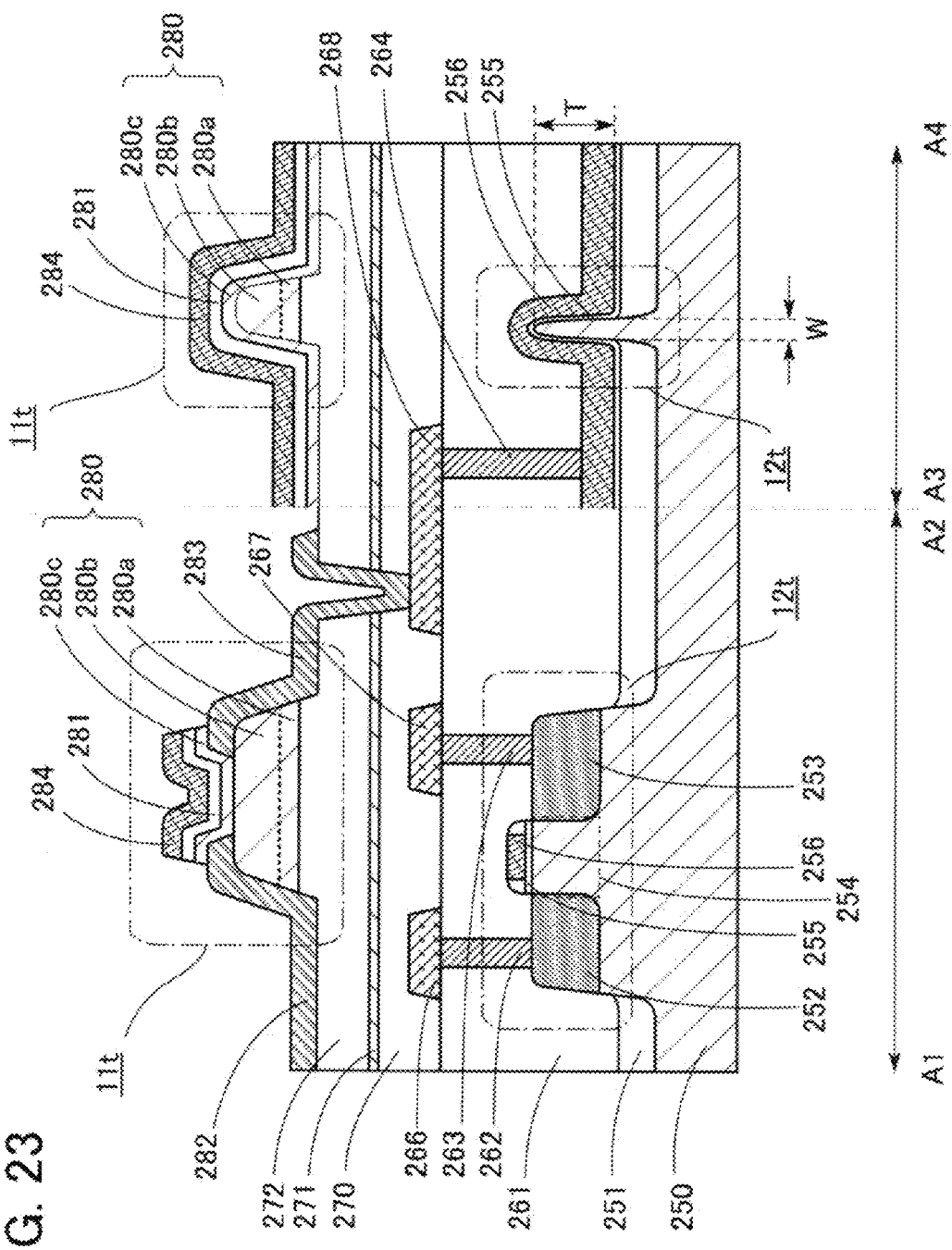
Figure 24A:
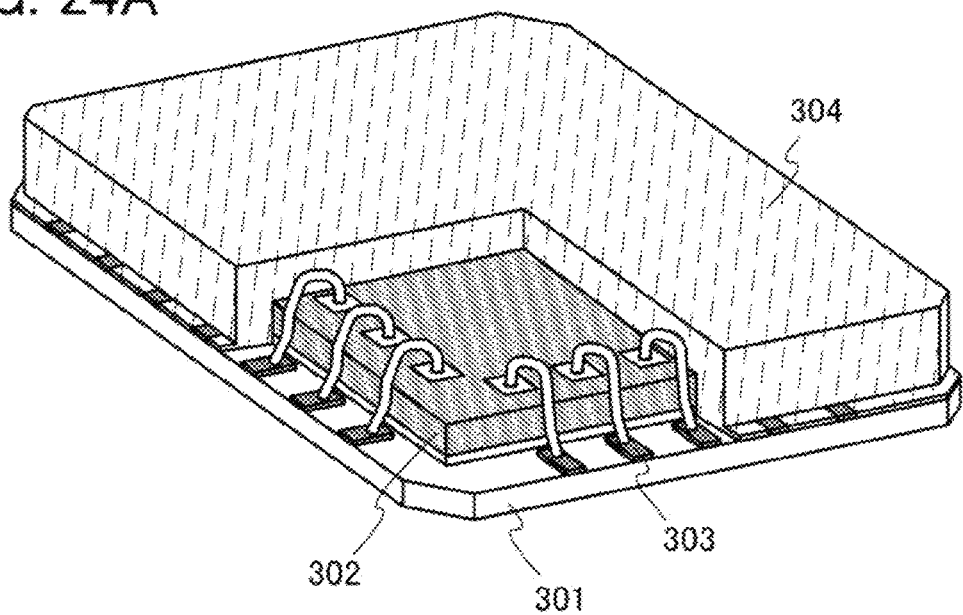
Figure 24B:
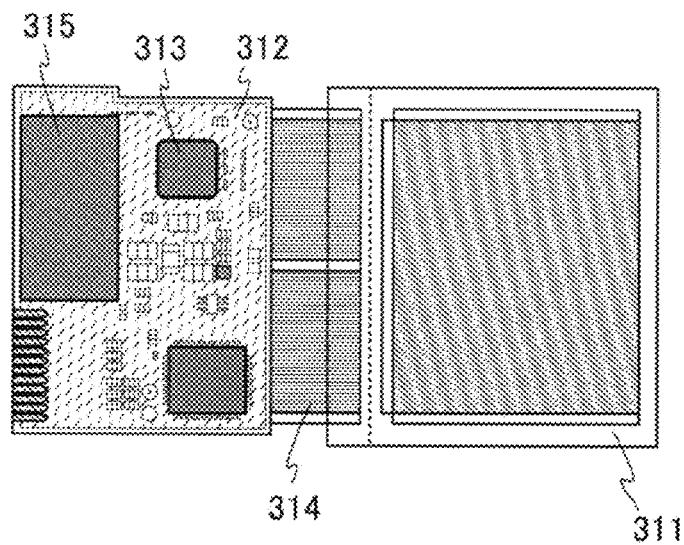

FIGS. 1A to 1C Structure examples of a switch circuit.
FIGS. 2A and 2B Structure examples of a switch circuit.
FIGS. 3A to 3C Structure examples of a switch circuit.
FIGS. 4A and 4B Structure examples of a switch circuit.
FIG. 5 A structure example of a switch circuit.
FIGS. 6A and 6B Structure examples of a switch circuit.
FIG. 7 A structure example of a driver circuit.
FIGS. 8A and 8B Structure examples of a switch circuit.
FIGS. 9A and 9b Structure examples of a switch circuit.
FIG. 10 A structure example of a switch circuit.
FIGS. 11A and 11B Structure examples of a switch circuit.
FIG. 12 A structure example of a switch circuit.
FIG. 13 A structure example of a switch circuit.
FIG. 14 A structure example of a driver circuit.
FIGS. 15A to 15C Structure examples of a programmable logic element.
FIG. 16 A timing chart.
FIGS. 17A to 17C Views illustrating a structure of a PLD.
FIG. 18 A view illustrating a structure of a switch circuit.
FIG. 19 A view illustrating a structure of a PLD.
FIG. 20 A plan view of a PLD.
FIGS. 21A to 21C Views illustrating a structure of a LUT.
FIG. 22 A cross-sectional view of a semiconductor device.
FIG. 23 A cross-sectional view of a semiconductor device.
FIGS. 24A to 24B Views illustrating a chip and a module.
FIG. 25 A view illustrating a system.
FIGS. 26A to 26F Views illustrating electronic devices.

Embodiments will be described in detail below with reference to the drawings. However, the present disclosure is not limited to the following description, and it is easily understood by those skilled in the art that various changes and modifications can be made in modes and details without departing from the spirit and scope of the present disclosure. Therefore, the present disclosure should not be interpreted as being limited to the description of the embodiments below. Furthermore, individual features described below or illustrated in the drawings may be combined with another feature or other features.

Note that a programmable logic device includes, in its category, a variety of semiconductor integrated circuits that use semiconductor elements, such as microprocessors, image processing circuits, controllers for semiconductor display devices, DSPs (digital signal processors), and microcontrollers. Furthermore, a semiconductor device includes, in its category, a variety of devices such as RF tags that use the above-described semiconductor integrated circuits and semiconductor display devices. The semiconductor display devices include, in its category, liquid crystal display devices, light-emitting devices in which a light-emitting element typified by an organic light-emitting element (OLED) is provided for each pixel, electronic paper, DMDs (digital micromirror devices), PDPs (plasma display panels), FEDs (field emission displays), and other semiconductor display devices in which a semiconductor element is included in a driver circuit.

EMBODIMENT 1

In this embodiment, described is a semiconductor device characterized by including a first wiring, a second wiring, a third wiring, a fourth wiring, a first switch, a second switch, a third switch, and a fourth switch. The first switch has a function of controlling conduction between the first wiring and a control terminal of the second switch. The second switch has a function of controlling conduction between the second wiring and the fourth wiring. The third switch has a function of controlling conduction between the second wiring and a control terminal of the fourth switch. The fourth switch has a function of controlling conduction between the third wiring and the fourth wiring. A first signal is supplied to the first wiring and the second wiring in a first period. A second signal is supplied to the second wiring and the third wiring in a second period. The third wiring and the fourth wiring are held at a constant potential determined independent of the first signal in the first period. The first switch and the third switch are in an on state in the first period. The first switch and the third switch are in an off state in the second period.

In an example of the semiconductor device, the first signal includes configuration data, the second signal includes data for arithmetic processing, the first signal is composed of a high level potential and a low level potential, and the constant potential is the low level potential.

In an example of the semiconductor device, the second switch is a first transistor, the semiconductor device further includes a second transistor having a conductivity type opposite to a conductivity type of the first transistor, a gate of the second transistor is directly or indirectly connected to a gate of the first transistor, and at least one of a source and a drain of the second transistor is held at the high level potential or a potential equivalent to the high level potential in the first period and the second period.

In an example of the semiconductor device, the semiconductor device further includes a third transistor having the same conductivity type as the first transistor has, at least one of a source and a drain of the third transistor is directly or indirectly connected to a gate of the first transistor, and a gate of the third transistor is held at the high level potential or a potential equivalent to the high level potential in the first period and the second period.

In an example of the semiconductor device, the first switch and the third switch are transistors including an oxide semiconductor film including a channel formation region. The oxide semiconductor film includes In, Ga, and Zn.

In an example of the semiconductor device, conduction between the second wiring and the fourth wiring is controlled by the second switch and a fifth switch, and conduction between the third wiring and the fourth wiring is controlled by the fourth switch and a sixth switch. In an example of the semiconductor device, the first signal is supplied to the third wiring in the first period.

<Structure Example 1 of Switch Circuit>

A structure example of a switch circuit will be described. As illustrated in FIG. 1(A), a switch circuit 10a includes a first wiring (a wiring 14[1]), a second wiring (a wiring 14[2]), a third wiring (a wiring 14[3]), a fourth wiring (a wiring 15[1]), a first switch (a switch 11 of a programmable switch 20a[1,2]), a second switch (a switch 12 of the programmable switch 20a[1,2]), a third switch (a switch 11 of a programmable switch 20a[1,3]), and a fourth switch (a switch 12 of the programmable switch 20a[1,3]).

A plurality of wirings 14 correspond to a plurality of programmable switches 20a. In FIG. 1(A), a case in which the wiring 14[j] (j=1, 2, 3) corresponds to the programmable switch 20a[1,j] is illustrated as an example.

The wiring 14[j−1] can be electrically connected to a node FD (a control terminal of the switch 12) in the programmable switch 20a[1,j] through the switch 11 included in the programmable switch 20a[1,j]. That is, the switch 11 has a function of controlling the supply of the potential of the wiring 14[j−1] to the node FD. Furthermore, the switch 12 is brought into a conducting state or a non-conducting state depending on the potential of the node FD.

Note that in this specification, "(electrically) connected state" means the state capable of transmitting a signal. Therefore, the electrically connected state means not only a state of direct connection but also a state of indirect connection through a circuit element such as a diode or a transistor, in which a signal can be transmitted. Furthermore, "(electrically) connectable" means a state of connection through a switch such as a transistor which can make the state capable of transmitting a signal by turning on the switch with the use of electrical, mechanical, or other means.

The signal supplied to the wirings 14 [0] to 14[3] differs depending on the period. In a first period, a signal including configuration data is supplied to the wirings 14[0] to 14[2]; accordingly, the configuration data is written into the switch circuit 10a to determine the state of the switches 12. In a second period, a signal for arithmetic processing is supplied to the wirings 14[1] to 14[3]. Although FIG. 1(A) illustrates an example of the switch circuit 10a with a small scale, the same can apply to larger-scale switch circuits.

Specifically, in the circuit illustrated in FIG. 1(A), when the signal including configuration data is supplied to the wirings 14[0] to 14[2] and the switches 11 are brought into a conducting state (ON) in the first period, a potential corresponding to the above signal is supplied to the nodes FD through the switches 11. Then, when the switches 11 are brought into a non-conducting state (OFF), the potential supplied to the nodes FD is held. Thus, the conducting/non-conducting state of the switches 12 is determined in accordance with the potentials of the nodes FD which reflects the configuration data. The operation of the switches 11 is controlled by a signal transmitted from a wiring 16.

Note that the programmable switch 20a in which the switch 12 is set in a conducting state is referred to as being in an on state, and the programmable switch 20a in which the switch 12 is set in a non-conducting state is referred to as being in an off state. As described later, the programmable switches 20a[1,1] to 20a[1,3] are set so that at most one of the programmable switches is in an on state. In some cases, the programmable switches 20a[1,1] to 20a[1,3] may be set so that none of the programmable switches is in an on state.

Furthermore, in the second period, the signal for arithmetic processing is supplied to the wirings 14[1] to 14[3], and whether the wirings 14[1] to 14[3] are electrically connected to or electrically isolated from the wiring 15[1] is determined depending on the states of the programmable switches 20a[1,1] to 20a[1,3]. In other words, electrical connection between the wirings 14[1] to 14[3] and the wiring 15[1] is determined in accordance with the configuration data written into each of the programmable switches 20a in the switch circuit 10a.

Note that in the second period, output signals from PLEs or I/O elements are supplied to the wirings 14[1] to 14[3]. The wiring 15[1] is electrically connected to an input terminal of a PLE or an I/O element. An I/O element functions as an interface that controls input of a signal from the outside of the PLD to a PLE or output of a signal from a PLE to the outside of the PLD. Determining the electrical connection between the wirings 14[1] to 14[3] and the wiring 15[1] in accordance with the configuration data means determining the electrical connection between output terminals of a plurality of PLEs or I/O elements and an input terminal of one PLE or I/O element.

Note that an input terminal in this specification refers to a node of a wiring or the like to which an input signal is supplied, and the potential, voltage, current, or the like of an input signal is supplied to a circuit through the node. Thus, a wiring electrically connected to the input terminal can be regarded as part of the input terminal. Moreover, an output terminal in this specification refers to a node of a wiring or the like to which an output signal is supplied, and the potential, voltage, current, or the like of an output signal is output from a circuit through the node. Thus, a wiring electrically connected to the output terminal can be regarded as part of the output terminal.

In one example, the electrical connection between a plurality of PLEs or I/O elements and one PLE or I/O element can be controlled by the above-described one switch circuit 10a. When the switches 11 in the switch circuit 10a are brought into a non-conducting state, the electrical connection can be maintained, which means that the switch circuit 10a can serve as a configuration memory. Accordingly, when the switch circuit 10a is used in the routing resource, the number of elements, such as transistors, included in the routing resource can be reduced; thus, the circuit scale of the PLD can be prevented from being increased and the area of the PLD can be kept small.

Other structure examples of the switch circuit will be described with reference to FIG. 1(B) and FIG. 1(C). A switch circuit 10b illustrated in FIG. 1(B) and a switch circuit 10c illustrated in FIG. 1(C) are formed by adding switches 13 to the programmable switches 20a illustrated in FIG. 1(A). The switches 13 may be single transistors or transistors which have different conductivity types and are connected in parallel like a transmission gate. In a programmable switch 20b (FIG. 1(B)), each of the switches 13 is provided between the wiring 14[$j$] and the switch 12; and in a programmable switch 20c (FIG. 1(C)), each of the switches 13 is provided between the wiring 15[1] and the switch 12. In either case, operation of the switch 13 is controlled by a signal transmitted from a wiring 17.

Since the switch 13 is electrically connected in series to the switch 12, the switch 13 and the switch 12 collectively have a function of controlling an electrical connection between the wiring 14 and the wiring 15. Specifically, when the switch 12 and the switch 13 are in a conducting state, the wiring 14 and the wiring 15 are electrically connected to each other. When at least one of the switch 12 and the switch 13 is in a non-conducting state, the wiring 14 and the wiring 15 are electrically isolated from each other.

Another structure example of the switch circuit will be described with reference to FIG. 2(A). FIG. 2(A) illustrates a structure example of a switch circuit 10d. The switch circuit 10d can achieve dynamic multi-context reconfiguration.

The switch circuit 10d illustrated in FIG. 2(A) has the same structure as the switch circuits 10a to 10c in that, for example, programmable switches 20[1,1] to 20[1,3] (the programmable switches 20 are, for example, the programmable switches 20a, the programmable switches 20b, the programmable switches 20c, or circuits having a function equivalent to that of those programmable switches) are connected to the wirings 14[0] to 14[3], the wiring 15[1], and the wiring 16[1]. However, the switch circuit 10d has a matrix structure further including a plurality of similar circuits, where the wirings 15[1] to 15[3] are provided with switches 18[1] to 18[3], respectively. The wirings 15[1] to 15[3] can be connected to an output terminal OUT through the switches 18[1] to 18[3], respectively. The switches 18[1] to 18[3] may be single transistors or transistors which have different conductivity types and are connected in parallel like a transmission gate. Note that the output terminal OUT is or can be directly or indirectly connected to a gate (a CMOS gate in general) of a transistor in a circuit of some kind, such as a PLE, and design is carried out so that the state of the transistor varies depending on the potential of the output terminal OUT.

Specifically, the switch circuit 10d illustrated in FIG. 2(A) includes programmable switches 20 in three rows and three columns. Three programmable switches 20 are connected to one wiring 15. A plurality of programmable switches 20 connected to the same wiring 15 are referred to as a programmable switch block 21. For example, the switch circuit 10d includes programmable switch blocks 21[1] to 21[3]; the programmable switch block 21 [$i$] ($i$=1, 2, 3) is composed of programmable switches 20[$i$, 1] to 20[$i$, 3]. The switch circuit 10d is an example with a small scale; however, the same can apply to the case of larger scales.

In the switch circuit 10d, writing of configuration data into the programmable switches 20 is performed on the programmable switch block 21 basis. Specifically, in the plurality of programmable switches 20 included in one programmable switch block 21, the switches 11 are brought into a conducting state and the signal including configuration data is supplied to the nodes FD through the switches 11. Then, in the plurality of programmable switches 20 included in the one programmable switch block 21, the switches 11 are brought into a non-conducting state to hold the potentials of the nodes FD. Then, in the plurality of programmable switches 20 included in another programmable switch block 21, a similar operation is repeated in order; in this manner, writing of configuration data into all the programmable switches 20 can be performed.

Furthermore, in the switch circuit 10d, any one of the switches 18[1] to 18[3] is turned on to select one of the programmable switch blocks 21. In the programmable switches 20 included in the selected programmable switch block 21, the electrical connection between the plurality of wirings 14 and the output terminal OUT can be determined in accordance with the held configuration data. In the case of changing the electrical connection between the plurality of wirings 14 and the output terminal OUT, another one of the switches 18[1] to 18[3] is selected, and the electrical connection between the plurality of wirings 14 and the output terminal OUT is determined in accordance with the configuration data held in the plurality of programmable switches 20 included in the selected programmable switch block 21.

Like the switch circuits 10a to 10c, the switch circuit 10d has a function of controlling an electrical connection between a plurality of PLEs or I/O elements and one PLE or I/O element and a function of a configuration memory which maintains the electrical connection. Accordingly, when the switch circuit 10d is used in the routing resource, the number of elements, such as transistors, included in the routing resource can be reduced; thus, the circuit scale of the PLD can be prevented from being increased and the area of the PLD can be kept small.

In addition, in the switch circuit 10d, a plurality of pieces of configuration data are held in the respective programmable switch blocks 21 and, in addition, configuration data can be selected freely by the selection of the programmable switch block 21.

In Patent Document 2 mentioned above, configuration data needs to be read from a DRAM to switch configuration data in a multi-context system, and a sense amplifier is required to read the configuration data. In the case of using the switch circuit 10d, configuration data need not be read using a sense amplifier every time the circuit structure is switched. Consequently, the time for switching the circuit structure can be shortened, and as a result, a logic circuit in a programmable logic device can be reconfigured at high speed.

Another structure example of the switch circuit will be described with reference to FIG. 2(B). FIG. 2(B) illustrates a structure example of a switch circuit 10e. The switch circuit 10e can also achieve dynamic multi-context reconfiguration.

In the switch circuit 10e, the programmable switches 20 are, for example, the programmable switches 20b, the programmable switches 20c, or circuits having a function equivalent to that of those programmable switches. The switch circuit 10e is different from the switch circuit 10d in that the wirings 15[1] to 15[3] are electrically connected to the output terminal OUT not via any switch and in that the switches 13 in the programmable switches 20 are controlled by wirings 17[1] to 17[3]. The switches 13 that can be controlled by any one of the wirings 17[1] to 17[3] can be turned on, and the others can be turned off.

Also in the switch circuit 10e, in a manner similar to that of the switch circuit 10d, writing of configuration data into the programmable switches 20 is performed on the programmable switch block 21 basis. Also in the switch circuit 10e illustrated in FIG. 2(B), in a manner similar to that of the switch circuit 10d, one of the programmable switch blocks 21 is selected, and the electrical connection between the plurality of wirings 14 and the output terminal OUT can be determined in accordance with the configuration data held in the plurality of programmable switches 20 included in the selected programmable switch block 21. In the case of changing the electrical connection between the plurality of wirings 14 and the output terminal OUT, in the switch circuit 10e, another one of the programmable switch blocks 21 is selected, and in the plurality of programmable switches 20 included in the selected programmable switch block 21, the electrical connection between the plurality of wirings 14 and the wiring 15 is determined in accordance with the held configuration data.

Note that in the switch circuits 10a to 10e, most of the wirings 14 have both a function of supplying a signal including configuration data to the programmable switch 20 and a function of supplying a signal output from a PLE or the like to the programmable switch 20. Thus, the number of wirings provided in the switch circuits 10a to 10e can be smaller than that of the structure in which two kinds of wirings, that is, a wiring having a function of supplying a signal including configuration data to the programmable switch 20 and a wiring having a function of supplying a signal output from a PLE to the programmable switch 20, are connected to the programmable switch 20. Therefore, by using the switch circuits 10a to 10e, downsizing of the routing resource can be achieved and the increase in layout area can be suppressed. The downsizing of the routing resource allows a downsizing of a semiconductor device.

<Specific Structure Example of Programmable Switch>

A specific structure example of the programmable switch 20 will be described. The programmable switch 20a[1,2] illustrated in FIG. 3(A) is connected to the wiring 14[1], the wiring 14[2], the wiring 15[1], and the wiring 16[1]. Moreover, the programmable switch 20a[1,2] illustrated in FIG. 3(A) includes at least a transistor 11t having a function of the switch 11 and a transistor 12t having a function of the switch 12.

Note that here, the transistor 11t is a transistor that uses an oxide semiconductor (OS transistor, to be described later), and the transistor 12t is a transistor that uses silicon (Si transistor). The transistor that uses an oxide semiconductor has a feature of high off-state resistance (low off-state current), and the transistor that uses silicon has a feature of low on-state resistance (high off-state current). For the details, Patent Document 1 may be referred to.

Specifically, in the programmable switch 20a[1,2], a gate of the transistor 11t is electrically connected to the wiring 16[1]. Furthermore, one of a source and a drain of the transistor 11t is electrically connected to the wiring 14[1], and the other is electrically connected to a gate of the transistor 12t. One of a source and a drain of the transistor 12t is electrically connected to the wiring 15[1], and the other is electrically connected to the wiring 14[2]. Note that the above connection may be indirect connection.

Alternatively, this connection relation can be represented that the gate of the transistor 12t (node FD) can be connected to the wiring 14[1] through the source and the drain of the transistor 11t and the wiring 14[2] can be connected to the wiring 15[1] through the source and the drain of the transistor 12t.

Note that a source of a transistor refers to a source region that is part of a semiconductor film functioning as an active layer or a source electrode electrically connected to the semiconductor film. Similarly, a drain of a transistor refers to a drain region that is part of a semiconductor film functioning as an active layer or a drain electrode electrically connected to the semiconductor film. Furthermore, a gate refers to a gate electrode.

The terms source and drain included in a transistor interchange with each other depending on the type of the channel of the transistor or levels of potentials applied to the respective terminals. In general, in an n-channel transistor, a terminal to which a lower potential is applied is called a source, and a terminal to which a higher potential is applied is called a drain. Furthermore, in a p-channel transistor, a terminal to which a lower potential is applied is called a drain, and a terminal to which a higher potential is applied is called a source. In this specification, although the connection relation of the transistor is described assuming that the source and the drain are fixed in some cases for convenience, actually, the names of the source and the drain may interchange with each other depending on the relation of the potentials.

As illustrated in FIG. 3(B), one electrode of a capacitor 19 may be connected to the gate of the transistor 12t. This enables the potential of the gate of the transistor 12t to be held for a longer time. Note that if this capacitance is too large, the boosting effect described later becomes small.

In FIG. 3(C), an example of a programmable switch 20c[1,2] is illustrated. The programmable switch 20c[1,2] is the programmable switch 20a[1,2] illustrated in FIG. 3(A) further including a transistor 13t having a function of the switch 13, and is, in terms of function, the same as the programmable switch 20c in the switch circuit 10c illustrated in FIG. 1(C). Specifically, one of a source and a drain of the transistor 12t is electrically connected to the wiring 14[2], and the other is electrically connected to one of a source and a drain of the transistor 13t. The other of the source and the drain of the transistor 13t is electrically connected to the wiring 15[1]. A gate of the transistor 13t is electrically connected to the wiring 17.

Alternatively, this connection relation can be represented that the gate of the transistor 12t (node FD) can be connected to the wiring 14[1] through the source and the drain of the transistor 11t, the wiring 14[2] can be connected to the source and the drain of the transistor 13t through the source and the drain of the transistor 12t, and the source and the drain of the transistor 12t can be connected to the wiring 15[1] through the source and the drain of the transistor 13t.

Note that by changing the order of the transistor 12t and the transistor 13t, a circuit corresponding to the programmable switch 20b can be formed. Furthermore, a capacitor may be provided as in the programmable switch 20a illustrated in FIG. 3(B).

FIG. 4(A) illustrates another example of the programmable switch 20a[1,2]. In the programmable switch 20a[1,2] illustrated in FIG. 4(A), the capacitor 19 in the programmable switch 20a[1,2] illustrated in FIG. 3(B) is formed using a p-channel transistor 19*tp*. Here, for example, a high-level potential and a low-level potential of the configuration data are +0.7 V and 0 V, respectively, and the potential of one or both of a source and a drain of the p-channel transistor 19*tp* is held at +0.7 V. A gate of the p-channel transistor 19*tp* is connected to the node FD. In addition, the thresholds of the transistor 11*t*, the transistor 12*t*, and the p-channel transistor 19*tp* are set at +1.5 V, +0.4 V, and −0.4 V, respectively.

For example, in the case where the programmable switch 20*a*[1,2] is set in an on state (in the case where the high-level potential is written into the node FD), the potential of the gate of the transistor 12*t* is initially +0.7 V. Thus, the MOS capacitance formed by the p-channel transistor 19*tp* is extremely low. To enhance the boosting effect that is to be described later, the capacitance of the capacitor 19 is preferably low; therefore, the sufficiently low MOS capacitance formed by the p-channel transistor 19*tp* is favorable.

Note that in the first period (writing of the configuration data), since the potential of the wiring 14[1] is +0.7 V, the potential of the other wirings 14 is 0 V. That is, both the potential of the wiring 14[2] and the potential of the wiring 15[1] can be 0 V. Accordingly, the gate capacitance of the transistor 12*t* becomes a maximum.

While, in the case where the programmable switch 20*a*[1,2] is set in an off state (in the case where the low-level potential is written into the node FD), the potential of the gate of the transistor 12*t* is initially 0 V. Thus, the MOS capacitance formed by the transistor 12*t* is extremely low. In contrast, the MOS capacitance formed by the p-channel transistor 19*tp* becomes a maximum. Consequently, the potential of the gate of the transistor 12*t* can be held stably.

In the second period especially, the potentials of the wirings 14 are not fixed to the low level and the average potential is higher than the low level. In such a case, even when the off-state resistance of the transistor 11*t* is significantly high, owing to the extremely low capacitance connected to the node FD, the time constant determined by the off-state resistance of the transistor 11*t* and the capacitance connected to the node FD becomes too small to be negligible compared with the uptime of the semiconductor device, and the potential of the node FD increases from the low level to an extent that cannot be ignored, in some cases. Accordingly, in the case of setting the potential of the node FD at the low level in the first period, a relatively high capacitance in the node FD is useful for potential stability.

Note that this capacitor can be formed using a MOS capacitor (MIS capacitor) instead of using a transistor. Furthermore, the potential of the source or the drain of the p-channel transistor 19*tp* is not limited to +0.7 V, and may be decreased when the potential of the node FD becomes the high-level potential as long as the capacitance of the p-channel transistor 19*tp* (or a MOS capacitor corresponding thereto) is sufficiently practical, and may be increased when the potential of the node FD becomes the low-level potential as long as the capacitance of the p-channel transistor 19*tp* is sufficiently practical. For example, considering the threshold, the high-level potential, and the low-level potential of the p-channel transistor 19*tp*, the potential of the source or the drain of the p-channel transistor 19*tp* may be higher than or equal to +0.4 V and lower than or equal to +1.0 V.

The capacitance connected to the node FD can be represented as $C_{oxn}+C_{oxp}+C_{const}$. Here, $C_{oxn}$ and $C_{oxp}$ are capacitance components which vary depending on the potential of the node FD, and are a capacitance component which increases when the potential of the node FD increases and a capacitance component which increases when the potential of the node FD decreases, respectively. The capacitance $C_{cst}$ is a capacitance component which does not depend on the potential of the node FD. Note that $C_{oxn}$ and $C_{oxp}$ can be, for example in FIG. 4(A), regarded as being part or whole of the capacitance component derived from the transistor 12*t* and part or whole of the capacitance component derived from the p-channel transistor 19*tp*, respectively.

When $C_{oxn}$ at the time when the potential of the node FD is at the low level is assumed to be 0 ($C_{oxn}(L)=0$), $C_{oxp}$ at the time when the potential of the node FD is at the high level is assumed to be 0 ($C_{oxp}(H)=0$), $C_{oxn}$ at the time when the potential of the node FD is at the high level is assumed to be $C_{oxn}(H)$, and $C_{oxp}$ at the time when the potential of the node FD is at the low level is assumed to be $C_{oxp}(L)$, these are finite positive values.

In order to efficiently utilize the boosting effect to be described later, it is preferable that $C_{oxn}(H)$ be higher than the other capacitances when the potential of the node FD is at the high level, that is, it is necessary that $C_{oxn}(H)$ be the same as or higher than $C_{cst}$ (Condition 1). For example, it is preferable that $C_{oxn}(H)$ be five times or more as high as $C_{cst}$ (Condition 1A).

Moreover, to reduce the variation in the potential of the node FD at the time when the potential of the node FD is at the low level to an extent equivalent to that at the time when the potential of the node FD is at the high level, it is preferable that the sum of $C_{oxp}(L)$ and $C_{cst}$ be 0.1 times or more as high as the sum of $C_{oxn}(H)$ and $C_{cst}$ (Condition 2). For example, it is preferable that the sum of $C_{oxp}(L)$ and $C_{cst}$ be 0.5 times or more as high as the sum of $C_{oxn}(H)$ and $C_{cst}$ (Condition 2A).

From the consideration of the above-described relation, for example, according to Condition 1 and Condition 2, it can be derived that $C_{oxn}(H)$ is preferably 1.25 times or more as high as $C_{oxp}(L)$. In addition, it can be derived from Condition 1A and Condition 2A that $C_{oxn}(H)$ is preferably 2.5 times or less as high as $C_{oxp}(L)$.

Note that this circuit structure in which the capacitance varies depending on the logical value can also be formed using an n-channel transistor (or an equivalent MOS capacitor). In the programmable switch 20*a*[1,2] illustrated in FIG. 4(B), the capacitor 19 in the programmable switch 20*a*[1,2] illustrated in FIG. 3(B) is formed using an n-channel transistor 19*tn*. Here, for example, a high-level potential and a low-level potential of the configuration data are +0.7 V and 0 V, respectively, and the potential of a gate of the n-channel transistor 19*tp* is held at +0.7 V. In addition, the thresholds of the transistor 11*t*, the transistor 12*t*, and the n-channel transistor 19*tn* are set at +1.5 V, +0.4 V, and +0.4 V, respectively.

Note that the potential of a source or a drain of the n-channel transistor 19*tn* is not limited to +0.7 V, and may be decreased when the potential of the node FD becomes the high-level potential as long as the capacitance of the n-channel transistor 19*tn* (or a MOS capacitor corresponding thereto) is sufficiently practical, and may be increased when the potential of the node FD becomes the low-level potential as long as the capacitance of the n-channel transistor 19*tn* is sufficiently practical. For example, considering the threshold, the high-level potential, and the low-level potential of the p-channel transistor 19*tn*, the potential of the source or the drain of the p-channel transistor 19*tn* may be higher than or equal to +0.4 V and lower than or equal to +1.0 V.

Also in the programmable switch 20*a*[1,2] illustrated in FIG. 4(B), if the potential of the node FD is at the low level, the capacitance of the n-channel transistor 19*tn* becomes a maximum, and in contrast, if the potential of the node FD is at the high level, the capacitance of the n-channel transistor 19*tn* becomes a minimum. Accordingly, in the above-described consideration, Coxp can be regarded as being part or whole of the capacitance derived from the n-channel transistor 19*tn*. In a manner similar to the above consideration, the capacitance range necessary for the n-channel transistor 19*tn* is derived.

In the case of employing the structure illustrated in FIG. 4(B), for example, the n-channel transistor 19*tn* may be a transistor of the same kind as the transistor 11*t*, a gate insulating film of the n-channel transistor 19*tn* may be a gate insulating film formed through the same process as the gate insulating film of the transistor 11*t*, and a gate electrode of the n-channel transistor 19*tn* may be a gate electrode formed through the same process as the gate electrode of the transistor 11*t*.

FIG. 5 illustrates another example of the programmable switch 20*a*[1,2]. In the programmable switch 20*a*[1,2] illustrated in FIG. 5, a transistor 11*tb* is provided between one electrode of the capacitor 19 and the gate of the transistor 12*t* in the programmable switch 20*a*[1,2] illustrated in FIG. 3(B). In this case, the transistor 11*tb* is turned on or off in synchronization with the transistor 11*t*, and thus is off in the second period. Although it depends on the degree of off-state resistance of the transistor 11*tb*, since a pulse flowing between the wiring 14[2] and the wiring 15[1] is not influenced by the capacitor 19 positioned beyond the transistor 11*tb*, the size of the capacitor 19 need not be considered when considering the boosting effect. Accordingly, the capacitance of the capacitor 19 can be made high enough.

In the case where the capacitance of the capacitor 19 is high enough, the potential of one electrode of the capacitor 19 is stable for a long enough time; as a result, the potential of the gate of the transistor 12*t* is also stable for a long enough time. In addition, the boosting effect in the second period is enhanced.

Examples of the basic programmable switch 20 have been described so far; another circuit element such as a transistor, a diode, a resistor, a capacitor, or an inductor may be further included as necessary.

<Specific Structure Example of Switch Circuit>

A switch circuit 10*f* illustrated in FIG. 6(A) includes programmable switches 20 arranged in a matrix of m rows and n columns (m and n are natural numbers of 3 or more), to which the wirings 14[0] to 14[*n*], the wirings 15[1] to 15[*m*], the wirings 16[1] to 16[*m*], the wirings 17[1] to 17[*m*] are connected. The circuit structure of the switch circuit 10*f* is similar to that of the switch circuit 10*e*, but can be similar to that of the switch circuit 10*d*, for example.

The switch circuit 10*f* includes a switch 22 for controlling an electrical connection between the output terminal OUT and a wiring 24 to which a predetermined potential is supplied. The conducting/non-conducting state of the switch 22 is selected (switched) in accordance with a signal INIT. Specifically, a potential of the wiring 24 is supplied to the wiring 24 when the switch 22 is in a conducting state, whereas a potential of the wiring 24 is not supplied to the output terminal OUT when the switch 22 is in a non-conducting state.

By setting the switch 22 in a conducting state, the potential of the output terminal OUT (and the wirings 15 connected thereto) can be initialized to be at a predetermined level. The potentials of the wirings 15 and the wirings 14 are likely to become indefinite state after the PLD is powered off. In addition, after the PLD is powered off, configuration data is sometimes lost depending on the structure of a storage element included in a configuration memory. In this case, if the PLD is powered on, electrical continuity is established between the wirings 15 and the plurality of wirings 14 through the switch circuit 10*f*, and a large amount of current may flow through these wirings when the wirings 15 and the plurality of the wirings 14 have different potentials. However, by initializing the potential of the wiring 15 as described above, a large amount of current can be prevented from flowing between the wirings 15 and the plurality of wirings 14. This can prevent breakage of the PLD.

The potential of the input terminal of the PLE (electrically connected to the output terminal OUT) sometimes becomes an intermediate potential between the high-level potential and the low-level potential immediately after the PLD is powered on. If the intermediate potential is supplied to the input terminal of the PLE, a flow-through current is likely to be generated in a CMOS circuit included in the PLE. However, since the potential of the output terminal OUT can be initialized as described above, the input terminal of the PLE can be prevented from having the intermediate potential immediately after power is turned on; thus, generation of the flow-through current can be prevented.

A latch may be electrically connected to the wirings 15. In FIG. 6(A), in addition to the switch 22 for performing initialization, a latch 23 is electrically connected to the wirings 15. The latch 23 has a function of keeping the potential of the wirings 15 (output terminal OUT), which are electrically connected to the input terminal of the PLE, high or low. When the latch 23 is electrically connected to the wirings 15, the potentials of the wirings 15 can be kept either high or low after the PLD is powered on. Accordingly, supply of an intermediate potential to the wirings 15 and, as a result, generation of a flow-through current in the PLE having the input terminal connected to the wirings 15 can be prevented.

FIG. 6(B) illustrates a specific circuit structure example of the switch 22 and the latch 23. The latch 23 includes an inverter 25 and a p-channel transistor 26. An input terminal of the inverter 25 is connected to the output terminal OUT, and an output terminal of the inverter 25 is connected to a gate of the transistor 26. A source and a drain of the transistor 26 are connected to a high-potential wiring 24H and the output terminal OUT, respectively. In addition, a source and a drain of a transistor 22*t* functioning as the switch 22 are connected to a low-potential wiring 24L and the output terminal OUT, respectively.

<Boosting Effect>

In the programmable switch 20, since the node FD is electrically floating owing to an extremely high property of insulation from another electrode or wiring when the switch 11 is in a non-conducting state, a boosting effect described below occurs.

In the programmable switch 20, when the node FD is in a floating state, in accordance with a change in the potential of the wiring 14 from the low level to the high level, the potential of the node FD is more or less increased owing to the capacitance Cgs formed between the source and the gate of the transistor 12*t*. The increase in the potential of the node FD depends on the logical value of configuration data input to the gate of the transistor.

Specifically, in the case where configuration data input to the programmable switch 20 is "0", if the transistor 12*t* is in a weak inversion mode, the capacitance Cgs that contributes to an increase in the potential of the node FD mainly includes a capacitance Cos that is independent of the potential of the gate electrode (that is, the potential of the node FD). Specifically, the capacitance Cos includes overlap capacitance generated in a region where the gate electrode and the source region overlap with each other, parasitic capacitance generated between the gate electrode and the source electrode, and the like.

While in the case where configuration data written into the programmable switch 20 is "1", if the transistor 12*t* is in a strong inversion mode, the capacitance Cgs that contributes to an increase in the potential of the node FD includes, in addition to the capacitance Cos, a capacitance Cox generated between a channel formation region and the gate electrode. The capacitance Cox is higher enough than the capacitance Cos.

Thus, the capacitance Cgs that contributes to an increase in the potential of the node FD is larger in the case where the configuration data is "1" than the case where the configuration data is "0".

Accordingly, in the programmable switch 20, in the case where the configuration data is "0", the change in the potential of the node FD is very small, whereas in the case where the configuration data is "1", the potential of the node FD can be increased more largely. Such an increase in the potential of the node FD is referred to as the boosting effect. Since the potential of the node FD can be increased largely by the boosting effect in the case where the configuration data is "1", the conducting state of the transistor 12t can be improved, and the switching speed of the programmable switch 20 can be improved. In contrast, in the case where the configuration data is "0", the potential of the node FD does not increase so much; accordingly, the non-conducting state of the transistor 12t functioning as the switch 12 can be ensured.

Note that in the case where a capacitor irrelevant to the change in the potential of the wiring 14 (or the wiring 15) is connected to the node FD, the boosting effect is small. Furthermore, in the case where there exists a capacitor that largely varies the potential of the node FD in accordance with the change in the potential of the wiring 14 (or the wiring 15), the wiring 14 and the wiring 15 are electrically connected regardless of the configuration data, which is not preferable. In other words, it is desired that the capacitance Cox be higher enough than the other capacitances.

It should be noted here that the transistor 12t needs to be in a strong inversion mode in order to obtain a large boosting effect. To make this state, at the time when the transistor 11t is on in the first period, if the potential of the gate of the transistor 12t (here, of an n-channel type) is at the high level, the potentials of the source and the drain are required to be at the low level or a potential equivalent thereto. If the potentials of the gate, source, and drain are each at the high level, the transistor 12t does not become in the strong inversion mode. Furthermore, if the gate and the drain are at the high level and the source is at the low level, a current flows between the source and the drain of the transistor 12t and thus breakage of the transistor 12t might occur.

In this respect, the programmable switches 20 illustrated in FIG. 3 and FIG. 4 each have a favorable circuit structure. First, in the first period, the wiring 15 can be set at the low level because the wiring 15 is not directly related to transmission of configuration data. This can be, for example, set by using the switch 22 as in the switch circuit 10f illustrated in FIG. 6(A). Next, in the first period, only one of the wirings 14 becomes at the high level. This is because one or none of the programmable switches 20 constituting the programmable switch block 21 is brought into an on state.

For example, in the programmable switch 20a[1,2] illustrated in FIG. 3(A), if the wiring 14[1] is at the high level, the wirings 14 other than the wiring 14[1] are at the low level; if the wiring 14[2] is at the high level, the wirings 14 other than the wiring 14[2] are at the low level.

For example, to set the programmable switch 20a[1,2] in an on state, the wiring 14[1] is set at the high level. When the transistor 11t is turned on, the potential of the node FD becomes at the high level. Since the wiring 14[1] is at the high level, the wiring 14[2] is at the low level as a matter of course.

At this time, since the wiring 15[1] is at the low level, the transistor 12t is set in the strong inversion mode.

For example, to set the programmable switch 20a[1,2] in an off state, the wiring 14[1] is set at the low level. When the transistor 11t is turned on, the potential of the node FD becomes at the low level. The wiring 14[2] is at the low level or the high level. The wiring 15[1] is at the low level. In any case, the potential of the gate of the transistor 12t is at the low level, and the transistor 12t is in a weak inversion mode. Thus, an excessive current does not flow between the source and the drain of the transistor 12t.

Moreover, for example, in the programmable switch 20c[1,2] illustrated in FIG. 3(C), the transistor 13t may be turned off in the first period. In this case, it does not matter if the potential of the wiring 15 [1] is either at the low level or at the high level.

<Structural Example of Driver Circuit>

A structural example of a driver circuit for controlling the supply of the signal including configuration data to the wirings 14 is illustrated in FIG. 7. A driver circuit 27a illustrated in FIG. 7 includes a selection circuit 28 (e.g., a shift register) which controls timing of sampling of a signal Sig including configuration data, a sample-and-hold circuit 29 which performs sampling of the signal and holding of the sampled signal with the timing determined by the selection circuit 28, and a plurality of switches 30 which control the supply of the sampled signal to the wirings 14[0] to 14[n−1]. FIG. 7 illustrates an example of the case of using three-state buffers that can be controlled with a signal WE as the switches 30.

Specifically, in FIG. 7, when the potential of the signal WE is at the high level, the switches 30 supply signals with the same logical values as signals input to input terminals to the wirings 14[0] to 14[n−1]. Furthermore, when the potential of the signal WE is at the low level, the switches 30 have high impedance and the signals input to the input terminals are not supplied to the wirings 14[0] to 14[n−1].

Note that since the signal including configuration data is not supplied to the wiring 14[n], the wiring 14[n] need not be connected to the driver circuit 27a. However, in such a case, the potential might become indefinite temporarily. To avoid this, as in FIG. 7, the switch 30[n] may also be connected to the wiring 14[n] so that the wiring 14[n] can supply a constant potential (VSS in FIG. 7) in accordance with the signal WE.

EMBODIMENT 2

In this embodiment, described is a semiconductor device characterized by including a plurality of first programmable logic elements, a second programmable logic element, a plurality of first wirings, a second wiring, and a plurality of circuits corresponding to the respective plurality of first wirings. A first signal is supplied to each of the plurality of first wirings in a first period, each of the plurality of first wirings is electrically connected to corresponding one of output terminals of the plurality of first programmable logic elements in a second period, and the second wiring is electrically connected to an input terminal of the second programmable logic element. The plurality of circuits each includes at least a first switch, a second switch, and a third switch, the third switch has a function of controlling conduction between one of the plurality of first wirings and one terminal of the second switch, the second switch has a function of being selected to be in a conducting state or a non-conducting state depending on the first signal supplied from one of the plurality of first wirings through the first switch, and the second switch has a function of controlling conduction between the second wiring and the other terminal of the third switch. In the first period, the second wiring is held at a constant potential independent of the first signal and the third switch is in an off state. In the second period, the first switch is in an off state and the third switch is in an on state.

In an example of the semiconductor device, the first signal includes configuration data and is composed of a high level potential and a low level potential, and the constant potential is the low level potential.

In an example of the semiconductor device, the second switch is a first transistor, a second transistor has a conductivity type opposite to a conductivity type of the first transistor, a gate of the second transistor is electrically connected to a gate of the first transistor, and at least one of a source and a drain of the second transistor is held at the high level potential or a potential equivalent to the high level potential in the first period and the second period.

In an example of the semiconductor device, the semiconductor device further includes a third transistor, the third transistor has the same conductivity type as the third transistor has, at least one of a source and a drain of the third transistor is electrically connected to a gate of the first transistor, and a gate of the third transistor is held at the high level potential or a potential equivalent to the high level potential in the first period and the second period.

In an example of the semiconductor device, the first switch is a transistor including an oxide semiconductor film including a channel formation region. The oxide semiconductor film includes In, Ga, and Zn.

<Structure Example 2 of Switch Circuit>

Another structure example of a switch circuit will be described. As illustrated in FIG. 8(A), a switch circuit 10g includes a first wiring (the wiring 14[1]), a second wiring (the wiring 15[1]), a first switch (a switch 11 of a programmable switch 31[1,2]), a second switch (a switch 12 of a programmable switch 31[1,2]), and a third switch (a switch 13 of a programmable switch 31[1,2]).

The wiring 14[j] (j=1, 2, 3) can be electrically connected to a node FD (a control terminal of the switch 12) in the programmable switch 31[1,j] through the switch 11 included in the programmable switch 31. That is, the switch 11 has a function of controlling the supply of the potential of the wiring 14[j] to the node FD. Furthermore, the switch 12 is brought into a conducting state or a non-conducting state depending on the potential of the node FD. The switch 13 is electrically connected in series to the switch 12 between the wiring 14[j] and the wiring 15[1]. Here, the switch 13 is provided between the wiring 14[j] and the switch 12. The operation of the switch 11 is controlled by the wring 16[1], and the operation of the switch 13 is controlled by the wiring 17[1]. The plurality of wirings 14 are supplied with a signal including configuration data or a signal for arithmetic processing and can be connected to another PLE or I/O element. Embodiment 1 can be referred to for the details.

For example, when the signal including configuration data is supplied to the wiring 14[j] and the switch 11 is brought into a conducting state (ON) in the first period, a potential corresponding to the above signal is supplied to the node FD through the switch 11. Then, when the switch 11 is brought into a non-conducting state (OFF), the potential supplied to the node FD is held. Thus, the conducting/non-conducting state of the switch 12 is determined in accordance with the potential of the node FD which reflects the configuration data.

Since the switch 13 is electrically connected in series to the switch 12, the switch 13 and the switch 12 collectively have a function of controlling an electrical connection between the wiring 14 and the wiring 15. Specifically, when the switch 12 and the switch 13 are both in a conducting state, the wiring 14 and the wiring 15 are electrically connected to each other. When at least one of the switch 12 and the switch 13 is in a non-conducting state, the wiring 14 and the wiring 15 are electrically isolated from each other.

Furthermore, in the second period, the signal for arithmetic processing is supplied to the wiring 14, and when the switch 13 is brought into a conducting state, whether the wiring 14 is electrically connected to or electrically isolated from the wiring 15 is determined depending on the conducting/non-conducting state of the switch 12. In other words, electrical connection between the plurality of wirings 14 and the wiring 15 is determined in accordance with the configuration data written into each of the programmable switches 31 in the switch circuit 10g.

Note that in the second period, output signals from PLEs or I/O elements are supplied to the wirings 14. The wiring 15 is electrically connected to an input terminal of a PLE or an I/O element. Embodiment 1 can be referred to for the details.

Another structure example of the switch circuit will be described. FIG. 8(B) illustrates a structure example of a switch circuit 10h. The switch circuit 10h can achieve dynamic multi-context reconfiguration.

The switch circuit 10h has the same structure as the switch circuit 10g in including the wiring 14, the wiring 15, the wiring 16, and the wiring 17. Furthermore, the switch circuit 10h has the same structure as the switch circuit 10 illustrated in FIG. 8(A) in including a plurality of programmable switches 31 that each include at least the switch 11, the switch 12, and the switch 13. However, the structure of the switch circuit 10 illustrated in FIG. 8(B) is different from that of the switch circuit 10 illustrated in FIG. 8(A) in that two or more programmable switches 31 correspond to arbitrarily selected one wiring 14, and a plurality of wirings 15 are joined to be the output terminal OUT.

Specifically, the switch circuit 10h illustrated in FIG. 8(B) includes programmable switches 31 in three rows and three columns. Three programmable switches 31 are connected to one wiring 15. A plurality of programmable switches 31 connected to the same wiring 15 are referred to as a programmable switch block 32. For example, the switch circuit 10h includes programmable switch blocks 32[1] to 32[3]; the programmable switch block 32[i] (i=1, 2, 3) is composed of programmable switches 31 [i, 1] to 31[i, 3]. The switch circuit 10h is an example with a small scale; however, the same can apply to the case of larger scales.

In the switch circuit 10h, writing of configuration data into the programmable switches 31 is performed on the programmable switch block 32 basis. Specifically, in the plurality of programmable switches 31 included in one programmable switch block 32, the switches 11 are brought into a conducting state and the signal including configuration data is supplied to the nodes FD through the switches 11. Then, in the plurality of programmable switches 31 included in the one programmable switch block 32, the switches 11 are brought into a non-conducting state to hold the potential of the nodes FD. Then, in the plurality of programmable switches 31 included in another programmable switch block 32, a similar operation is repeated in order; in this manner, writing of configuration data into all the programmable switches 31 can be performed.

Furthermore, in the switch circuit 10h, one of the plurality of programmable switch blocks 32 is selected. In the programmable switches 31 included in the selected programmable switch block 32, the electrical connection between the plurality of wirings 14 and the output terminal OUT can be determined in accordance with the held configuration data. In the case of changing the electrical connection between the plurality of wirings 14 and the output terminal OUT, in the switch circuit 10*h*, another one of the programmable switch blocks 32 is selected, and the electrical connection between the plurality of wirings 14 and the output terminal OUT is determined in accordance with the configuration data held in the plurality of programmable switches 31 included in the selected programmable switch block 32. The selection of the programmable switch block 32 can be made by turning on the switch 13 by control of the potential of the corresponding wiring 17.

Like the switch circuit 10*g*, the switch circuit 10*h* has a function of controlling an electrical connection between a plurality of PLEs or I/O elements and one PLE or I/O element and a function of a configuration memory which maintains the electrical connection. Accordingly, when the switch circuit 10*h* is used in the routing resource, the number of elements, such as transistors, included in the routing resource can be reduced; thus, the circuit scale of the PLD can be prevented from being increased and the area of the PLD can be kept small.

In addition, in the switch circuit 10*h*, a plurality of pieces of configuration data are held in the respective programmable switch blocks 32 and, in addition, configuration data can be selected freely by the selection of the programmable switch block 32.

In the switch circuit 10*h*, writing of configuration data into the programmable switches 31 is performed on the programmable switch block 32 basis. Specifically, in the plurality of programmable switches 31 included in one programmable switch block 32, the switches 11 are brought into a conducting state and the signal including configuration data is supplied to the nodes FD through the switches 11.

Then, in the plurality of programmable switches 31 included in the one programmable switch block 32, the switches 11 are brought into a non-conducting state to hold the potential of the nodes FD. Then, in the plurality of programmable switches 31 included in another programmable switch block 32, a similar operation is repeated in order; in this manner, writing of configuration data into all the programmable switches 31 can be performed.

In the switch circuit 10*h*, one of the plurality of programmable switch blocks 32 is selected, and the electrical connection between the plurality of wirings 14 and the output terminal OUT can be determined in accordance with the configuration data held in the plurality of programmable switches 31 included in the selected programmable switch block 32.

In the case of changing the electrical connection between the plurality of wirings 14 and the output terminal OUT, in the switch circuit 10*h*, another one of the programmable switch blocks 32 is selected, and in the plurality of programmable switches 31 included in the selected programmable switch block 32, the electrical connection between the plurality of wirings 14 and the wiring 15 is determined in accordance with the held configuration data.

Note that in the switch circuits 10*g* and 10*h*, the wirings 14 have both a function of supplying a signal including configuration data to the programmable switch 31 and a function of supplying a signal output from a PLE or the like to the programmable switch 31.

Thus, the number of wirings provided in the switch circuits 10*g* and 10*h* can be smaller than that of the structure in which two kinds of wirings, that is, a wiring having a function of supplying a signal including configuration data to the programmable switch 31 and a wiring having a function of supplying a signal output from a PLE to the programmable switch 31, are connected to the programmable switch 31.

Therefore, by using the switch circuits 10*g* and 10*h*, downsizing of the routing resource can be achieved and the increase in layout area can be suppressed. The downsizing of the routing resource allows a downsizing of a semiconductor device.

<Specific Structure Example of Programmable Switch>

A specific structure example of the programmable switch 31 will be described. The programmable switch 31[1,2] illustrated in FIG. 9(A) is connected to the wiring 14[2], the wiring 15[1], and the wiring 16[1]. Moreover, the programmable switch 31[1,2] illustrated in FIG. 9(A) includes at least a transistor 11*t* having a function of the switch 11, a transistor 12*t* having a function of the switch 12, and a transistor 13*t* having a function of the switch 13.

Note that here, the transistor 11*t* is a transistor that uses an oxide semiconductor (OS transistor, to be described later), and the transistor 12*t* and the transistor 13*t* are transistors that use silicon (Si transistor).

Specifically, in the programmable switch 31[1,2], a gate of the transistor 11*t* is electrically connected to the wiring 16[1]. Furthermore, one of a source and a drain of the transistor 11*t* is electrically connected to the wiring 14[2], and the other is electrically connected to a gate of the transistor 12*t*. One of a source and a drain of the transistor 12*t* is electrically connected to the wiring 15[1], and the other is electrically connected to one of a source and a drain of the transistor 13*t*. The other of the source and the drain of the transistor 13*t* is electrically connected to the wiring 14[2]. A gate of the transistor 13*t* is electrically connected to the wiring 17. Note that the above connection may be indirect connection.

Alternatively, this connection relation can be represented that the gate of the transistor 12*t* (node FD) can be connected to the wiring 14[2] through the source and the drain of the transistor 11*t*, the wiring 14[2] can be connected to the source and the drain of the transistor 12*t* through the source and the drain of the transistor 13*t*, and the source and the drain of the transistor 13*t* can be connected to the wiring 15[1] through the source and the drain of the transistor 12*t*.

As illustrated in FIG. 9(B), one electrode of a capacitor 19 may be connected to the gate of the transistor 12*t*. This enables the potential of the gate of the transistor 12*t* to be held for a longer time. Note that if this capacitance is too large, the boosting effect described later becomes small.

FIG. 10 illustrates another example of the programmable switch 31 [1,2]. In the programmable switch 31[1,2] illustrated in FIG. 10, the switch 13 is a transmission gate formed of an n-channel transistor 13*tn* and a p-channel transistor 13*tp*.

Specifically, a gate of the n-channel transistor 13*tn* and a gate of the p-channel transistor 13*tp* are electrically connected to the wiring 17*n*[1] and the wiring 17*p*[1], respectively. In addition, one of a source and a drain of the n-channel transistor 13*tn* and one of a source and a drain of the p-channel transistor 13*tp* are both electrically connected to the wiring 14[2]. The other of the source and the drain of the n-channel transistor 13*tn* and the other of the source and the drain of the p-channel transistor 13*tp* are both electrically connected to the other of the source and the drain of the transistor 12*t*.

In the case where the switch 13 is a single transistor as illustrated in FIG. 9(A), when the high level potential of the wiring 17 for turning on the transistor 13*t* is equal to the high level potential of the wiring 14, the potential of the wiring 15 is lower than the above-described high level potential by the threshold of the transistor 13*t*. To prevent this, the high level potential of the wiring 17 is required to have a value that is higher than the high level potential of the wiring 14 by the threshold of the transistor 13*t*. While in the case where the switch 13 is a transmission gate as illustrated in FIG. 10, even when the high level potential of the wiring 17 is equal to the high level potential of the wiring 14, the potential of the wiring 15 has a value equivalent to the above-described high level potential.

FIG. 11(A) and FIG. 11(B) illustrate other examples of the programmable switch 31 [1,2]. In the programmable switches 31 [1,2] illustrated in FIG. 11(A) and FIG. 11(B), the capacitor 19 in the programmable switch 31[1,2] illustrated in FIG. 9(B) is formed using a p-channel transistor 19tp or an n-channel transistor 19tn. Embodiment 1 can be referred to for the details.

FIG. 12 illustrates another example of the programmable switch 31 [1,2]. In the programmable switch 31[1,2] illustrated in FIG. 12, a transistor 11tb is provided between one electrode of the capacitor 19 and the gate of the transistor 12t in the programmable switch 31 [1,2] illustrated in FIG. 9(B). Embodiment 1 can be referred to for the effect of this structure.

Examples of the basic programmable switch 31 have been described so far; another circuit element such as a transistor, a diode, a resistor, a capacitor, or an inductor may be further included as necessary.

<Specific Structure Example of Switch Circuit>

A switch circuit 10i illustrated in FIG. 13 includes programmable switches 31 arranged in a matrix of m rows and n columns (m and n are natural numbers of 3 or more), to which the wirings 14[1] to 14[n], the wirings 15[1] to 15[m], the wirings 16[1] to 16[m], the wirings 17[1] to 17[m] are connected. The circuit structure of the switch circuit 10i is similar to that of the switch circuit 10h.

The switch circuit 10i includes a switch 22 for controlling an electrical connection between the output terminal OUT and a wiring 24 to which a predetermined potential is supplied. The conducting/non-conducting state of the switch 22 is selected (switched) in accordance with a signal NIT. Furthermore, a latch 23 may be electrically connected to the wiring 15. For these, Embodiment 1 can be referred to.

<Boosting Effect>

Also in the programmable switch 31, the boosting effect similar to that described in Embodiment 1 occurs. In the programmable switch 31, when the node FD is in a floating state at the time when the switch 13 (the transistor 13t) is on, in accordance with a change in the potential of the wiring 14 from the low level to the high level, the potential of the node FD is more or less increased owing to the capacitance Cgs formed between the source and the gate of the transistor 12t. Embodiment 1 can be referred to for the details.

Note that in the programmable switches 31 illustrated in FIG. 9 to FIG. 11, by turning off the transistor 13t in the first period, the potential of one of the source and the drain of the transistor 12t, which is connected to the transistor 13t, is independent of the wiring 14 (either at the high level or the low level because the configuration data is transmitted).

For example, when the potential of the wiring 14 is at the high level and the transistor 11t is in an on state, the transistor 12t is in an on state. Furthermore, since the transistor 13t is in an off state, the potentials of the source and the drain of the transistor 12t are electrically isolated from the potential (high level) of the wiring 14 and are not influenced. Since the potential of the wiring 15 can be at the low level, the potentials of the source and the drain of the transistor 12t are both at the low level. As a result, when the node FD is in a floating state, a large boosting effect can be obtained.

<Structural Example of Driver Circuit>

A structural example of a driver circuit for controlling the supply of the signal including configuration data to the wirings 14 is illustrated in FIG. 14. A driver circuit 27b illustrated in FIG. 14 includes a selection circuit 28 such as a shift register, which controls timing of sampling of a signal Sig including configuration data, a sample-and-hold circuit 29 which performs sampling of the signal and holding of the sampled signal with the timing determined by the selection circuit 28, and a plurality of switches 30 which control the supply of the sampled signal to the wirings 14[1] to 14[n]. FIG. 14 illustrates an example of the case of using three-state buffers that can be controlled with a signal WE as the switches 30.

Specifically, in FIG. 14, when the potential of the signal WE is at the high level, the switches 30 supply signals with the same logical values as signals input to input terminals to the wirings 14[1] to 14[n]. Furthermore, when the potential of the signal WE is at the low level, the switches 30 have high impedance and the signals input to the input terminals are not supplied to the wirings 14[1] to 14[n]. Note that the signal used for performing arithmetic in the second period can also be supplied to the wirings 14[1] to 14[n] using this driver circuit 27b.

EMBODIMENT 3

Structural Example of PLE

FIG. 15(A) illustrates an example of a PLE. A PLE 40a illustrated in FIG. 15(A) includes a LUT (lookup table) 34, a flip-flop 35, and a configuration memory 36. The configuration memory 36 has a function of storing configuration data transmitted from a memory element. Logic operation determined by the LUT 34 varies depending on configuration data stored in the configuration memory 36. When logic operation to be performed by the LUT 34 is determined in accordance with the configuration data, the LUT 34 outputs an output signal corresponding to a plurality of input signals input to input terminals 37. The flip-flop 35 holds the signal output from the LUT 34 and outputs an output signal corresponding to the signal in synchronization with a clock signal CK.

A switch 38 has a function of controlling the supply of the signal, which is output from the flip-flop 35, to a terminal 39. FIG. 15(A) illustrates an example where a three-state buffer which can be controlled in accordance with a signal EN is used as the switch 38.

Specifically, in FIG. 15(A) when the potential of the signal EN is at a high level, the switch 38 supplies a signal with the same logical value as a signal input to an input terminal to the outside (e.g., the wiring 14) through the terminal 39. When the potential of the signal EN is at a low level, the switch 38 has high impedance and the signal input to the input terminal is not supplied to the outside.

Note that the PLE 40a may further include a multiplexer to select whether the output signal from the LUT 34 passes through the flip-flop 35 or not.

The type of the flip-flop 35 may be determined by configuration data. Specifically, the flip-flop 35 may have a function of any of a D flip-flop, a T flip-flop, a JK flip-flop, and an RS flip-flop depending on the configuration data.

FIG. 15(B) illustrates a PLE 40b which is another example of the PLE. The PLE 40b illustrated in FIG. 15(B) includes an AND gate 41 in addition to the components of the PLE 40a illustrated in FIG. 15(A). To the AND gate 41, a signal from the flip-flop 35 is applied as a positive logic input, and the signal NIT for initializing the potential of the wiring 15 is applied as a negative logic input. With the above structure, an output signal from the PLE 40 can have the same potential as the low-potential wiring 24L illustrated in FIG. 6(B) when the potential of the wiring 15 illustrated in FIG. 6(B) is initialized in accordance with the signal NIT. As a result, a large amount of current can be prevented from flowing through the wiring 15 and the plurality of wirings 14 to which the output signal from the PLE 40b is applied. Thus, breakage of the PLD can be prevented.

FIG. 15(C) illustrates a PLE 40c which is another example of the PLE. The PLE 40c illustrated in FIG. 15(C) includes a multiplexer 42 and a configuration memory 43 in addition to the components of the PLE 40a in FIG. 15(A). In FIG. 15(C), an output signal from the LUT 34 and an output signal from the flip-flop 35 are input to the multiplexer 42. The multiplexer 42 has a function of selecting and outputting one of the above two output signals in accordance with configuration data stored in the configuration memory 43. An output signal from the multiplexer 42 is supplied to the wiring 14 through the switch 38.

<Operation Example of Switch Circuit>

Next, an example of the operation of the switch circuit 10f illustrated in FIG. 6(A) will be described with reference to a timing chart in FIG. 16. The timing chart in FIG. 16 shows the signal WE for controlling the operation of the switch 30 in the driver circuit 27a illustrated in FIG. 7, and the clock signal CK for controlling output of the output signal from the flip-flop 35 and the signal EN for controlling the operation of the switch 38 in the PLE 40 illustrated in FIG. 15(A). The timing chart in FIG. 16 shows an example where the transistors 11t to 13t are n-channel transistors. Note that a low-level potential VSS is applied to the wiring 24.

Note that as the PLEs, the PLEs 40a illustrated in FIG. 15(A) are used, and the output terminals 39 of the PLEs 40a are directly or indirectly connected to their corresponding wirings 14. In addition, the output terminal OUT of the switch circuit 10f is directly or indirectly connected to any of the input terminals 37 of the above or other PLEs 40a.

First, the description is made on initialization of the potential of the wiring 15 (the output terminal OUT) that is performed from time T1 to time T2 after the PLD is powered on.

From the time T1 to the time T2, the signal NIT with high-level potential is input to a gate of the transistor (the transistor 22t in FIG. 6(B)) used as the switch 22, so that the switch 22 is brought into a conducting state. Accordingly, the potential VSS of the wiring 24 is supplied to the wiring 15 through the switch 22.

Application of the potential VSS to the wiring 15 enables the potential of the wiring 15 to be initialized even when the potential of the wiring 15 is indefinite immediately after power is supplied to the PLD. Accordingly, the potential of the input terminal of the PLE connected to the wiring 15 is not indefinite and a flow-through current can be prevented in the CMOS circuit included in the PLE. This can prevent breakage of the PLD. Note that when the PLD is powered on and the potential of the signal NIT is set to the high level at the same time, a period during which the potential of the wiring 15 is indefinite can be shortened.

Furthermore, from the time T1 to the time T2, a low-level potential is applied to the wirings 17[1] to 17[m], so that the transistor 13t in each programmable switch 20 is turned off. Accordingly, the wiring 15 can be electrically isolated from the plurality of wirings 14. In addition, from the time T1 to the time T2, the potential of the signal EN is at the low level, the potential of the signal WE is at the high level, and a low-level potential, specifically the potential VSS which is the same potential as the wiring 24, is applied from the driver circuit 27a to the wirings 14[0] to 14[n]. Accordingly, the level of the potential of the wiring 15 can be substantially the same as those of the plurality of wirings 14. Thus, a large amount of current can be prevented from flowing between the wiring 15 and the plurality of wirings 14 after power is supplied to the PLD. This can prevent breakage of the PLD.

After the initialization of the potential of the wiring 15, from time T3, the potential of the signal INIT is maintained at a low level and the switch 22 is brought into a non-conducting state.

Next, writing of configuration data performed from the time T3 to time T5 is described. The potential of the signal EN is at the low level in the above period; thus, the supply of a signal from the PLE 40a to the wiring 14 is stopped. Furthermore, the potential of the signal WE becomes high in the above period; thus, a signal including configuration data is supplied from the driver circuit 27a to the wirings 14[0] to 14[n−1]. The potential of the wiring 14[n] is maintained at the low level. In addition, a low-level potential is supplied to all the wirings 17.

From the time T3 to the time T4, a high-level potential is supplied to the wiring 16 and a low-level potential is supplied to all the wirings 16 except the wiring 16[1]. Further, a high-level potential is supplied to the wiring 14[1] and a low-level potential is supplied to all the wirings 14 except the wiring 14[1]. By the above operation, configuration data is written into the programmable switch block 21[1] (the programmable switch 20[1,1] to the programmable switch 20[1,n]). Specifically, a high-level potential is supplied to the node FD in the programmable switch 20[1,2], so that configuration data corresponding to a logical value "1" is stored. Meanwhile, a low-level potential is supplied to the node FD in the programmable switch 20[1,j] (j is a natural number of 1, or 3 or more and n or less), so that configuration data corresponding to a logical value "0" is stored.

Next, from the time T4 to the time T5, a low-level potential is supplied to all the wirings 16 except the wiring 16[m], and a high-level potential is supplied to the wiring 16[m]. Further, a high-level potential is supplied to the wiring 14[m−1] and a low-level potential is supplied to all the wirings 14 except the 14[m−1]. By the above operation, configuration data is written into the programmable switch block 21[m] (the programmable switch 20[m,1] to the programmable switch 20[m,n]. Specifically, a high-level potential is supplied to the node FD in the programmable switch 20[m,n], so that configuration data corresponding to a logical value "1" is stored. Meanwhile, a low-level potential is supplied to the node FD in the programmable switch 20[m,j] (j is a natural number of less than n), so that configuration data corresponding to a logical value "0" is stored.

Although the timing chart in FIG. 16 shows only writing of configuration data to the programmable switch 20[1,2], the programmable switch 20[1,n], the programmable switch 20[m,2] and the programmable switch 20[m,n], configuration data can be written into the other programmable switches 20 in a similar manner. Note that the signal pulse of the wiring 14 is preferably delayed relative to the signal pulse of the wiring 16 so that the signal pulse of the wiring 14 starts decreasing from the high level after the signal pulse of the wiring 16 changes from the high level to the low level.

Next, switching of the circuit structure from time T6 to time T8 is described. The potential of the signal EN becomes high in the above period; thus, a signal is supplied from the PLE 40a to the wiring 14. Furthermore, the potential of the signal WE becomes low in the above period; thus, the supply of a signal including configuration data from the driver circuit 27a to the wiring 14 is stopped.

First, a low-level potential is supplied to all the wirings 16 from the time T6 to the time T7. Further, a high-level potential is supplied to the wiring 17[1] and a low-level potential is supplied to all the wirings 17 except the wiring 17[1]. By the above operation, an electrical connection between the wirings 14[1] to 14[n] and the wiring 15 is determined by the programmable switch 20[1,1] to the programmable switch 20[1, n] connected to the wiring 17[1]. Specifically, configuration data corresponding to a logical value "1" is stored in the circuit 20[1,2] among the programmable switches 20[1,1] to 20[1,n]; thus, the wiring 14[2] and the output terminal OUT are electrically connected to each other through the programmable switch 20[1,2] and the wiring 15[1].

Then, a low-level potential is supplied to all the wirings 16 from the time T7 to the time T8. Furthermore, a low-level potential is supplied to all the wirings 17 except the wiring 17[m] and a high-level potential is supplied to the wiring 17[m]. By the above operation, an electrical connection between the wirings 14[1] to 14[n] and the wiring 15[m] is determined by the programmable switch 20[m,1] to the programmable switch 20[m,n] connected to the wiring 17[m]. Specifically, among the programmable switches 20[m,1] to 20[m,n], configuration data corresponding to a logical value "1" is stored in the programmable switch 20 [m,n]; thus, the wiring 14[n] and the output terminal OUT are electrically connected to each other through the programmable switch 20[m,n] and the wiring 15[m].

Rewriting of configuration data can be performed by repeating the above operation from the time T1 to the time T5. Note that by using the switch circuit 10c (the programmable switch 20c), data rewriting can be performed without the initialization of the wirings 15; in other words, only the above operation from the time T3 to the time T5 is necessary. This is based on the following reasons.

The potentials of the wirings 15 are fixed at either the high level or the low level by the latch 23. For rewriting configuration data, potentials of all the wirings 17 are set to be low level; accordingly, the switches 13 are in an off state, and thus the wirings 15 and the wirings 14 are brought out of conduction. For this reason, whichever of high- and low-level potentials the wirings 14 and the wirings 15 have, a current does not flow therebetween.

In writing configuration data, the plurality of wirings 14 do not have high level potentials, and the potentials of both a source and a drain and the potential of a gate of the transistor 12t corresponding to the switch 12 are at the low level and the high level, respectively, in the programmable switch 20 into which "1" is written; accordingly, a boosting effect can be obtained.

Although FIG. 16 shows the case where the potential of the wiring 15 is initialized after power is supplied, the potentials of the nodes FD in the programmable switches 20 can be initialized in addition to the potential of the wiring 15. The potentials of the nodes FD may be sequentially initialized on the programmable switch 20 basis, or the potentials of the nodes FD in all the programmable switches 20 may be initialized all at once.

Note that the switch circuit 10i illustrated in FIG. 13 can be operated in a similar manner in accordance with the timing chart in FIG. 16.

<Structure Example of PLD>

A structure example of the PLD which includes the switch circuit 10 (including but not limited to the above-described switch circuits 10a to 10i) and the PLE 40 (including but not limited to the above-described PLEs 40a to 40c) will be described. FIG. 17(A) illustrates part of the structure of a PLD 50.

In FIG. 17(A), a PLE block 51 [1] including a plurality of PLEs 40, a PLE block 51[2] including a plurality of PLEs 40, and a PLE block 51[3] including a plurality of PLEs 40 are provided in the PLD 50. FIG. 17(A) illustrates an example where the PLE block 51[1], the PLE block 51[2], and the PLE block 51[3] are positioned in parallel in this order from the left.

In FIG. 17(A), a plurality of wirings 52, a plurality of wirings 53, a plurality of wirings 54, a plurality of wirings 55, a plurality of wirings 56, a plurality of wirings 57, and a plurality of wirings 58 are provided in the PLD 50. The plurality of wirings 52 to the plurality of wirings 58 correspond to the wirings 14.

A first output terminal of each PLE 40 in the PLE block 51[1] is connected to any one of the plurality of wirings 52. A second output terminal of each PLE 40 in the PLE block 51[1] is connected to any one of the plurality of wirings 53.

A first output terminal of each PLE 40 in the PLE block 51[2] is connected to any one of the plurality of wirings 55. A second output terminal of each PLE 40 in the PLE block 51[2] is connected to any one of the plurality of wirings 56.

A first output terminal of each PLE 40 in the PLE block 51[3] is electrically connected to any one of the plurality of wirings 54. A second output terminal of each PLE 40 in the PLE block 51[3] is connected to any one of the plurality of wirings 58.

Note that the number of first output terminals and the number of second output terminals of each PLE 40 are not limited to one, and either or both of the number of first output terminals and the number of second output terminals may be more than one. Alternatively, either the first output terminals or the second output terminals may be omitted. Note also that one output terminal is always connected to one wiring even when the number of first output terminals is more than one or the number of second output terminals is more than one. Thus, when one PLE block includes Y PLEs 40 (Y is a natural number), the PLD 50 at least includes Y wirings connected to the first output terminals and Y wirings connected to the second output terminals.

The PLE block 51[1] is placed between the plurality of wirings 52 and the plurality of wirings 53. The PLE block 51 [2] is placed between the plurality of wirings 55 and the plurality of wirings 56. The PLE block 51[3] is placed between the plurality of wirings 54 and the plurality of wirings 58.

Furthermore, the plurality of wirings 55, which are connected to the first output terminals of the PLEs 40 in the PLE block 51 [2], are provided both between the PLE block 51[1] and the PLE block 51 [2] and between the PLE block 51[1] and a PLE block (not illustrated) positioned on the left side of the PLE block 51[1]. The plurality of wirings 54, which are connected to the first output terminals of the PLEs 40 in the PLE block 51[3], are provided both between the PLE block 51[1] and the PLE block 51 [2] and between the PLE block 51[2] and the PLE block 51[3]. The plurality of wirings 57 connected to first output terminals of the PLE block (not illustrated) positioned on the right side of the PLE block 51[3] are provided both between the PLE block 51[2] and the PLE block 51[3] and between the PLE block 51[3] and a PLE block (not illustrated) positioned on the right side of the PLE block 51[3].

When attention is focused on a PLE block 51 [N] (N is a natural number of 3 or more), a plurality of wirings connected to first output terminals of the PLEs 40 in the above PLE block are provided both between the PLE block [N] and a PLE block [N−1] and between the PLE block [N−1] and a PLE block [N−2]. In the case where N is 2, a plurality of wirings connected to the first output terminals of the PLEs 40 in the PLE block [2] are provided both between the PLE block [2] and the PLE block [1] and between the PLE block [1] and an I/O element. The I/O element has a function of an interface that controls input of signals to the PLEs 40 from the outside of the PLD or output of signals from the PLEs 40 to the outside of the PLD.

Furthermore, when attention is focused on the PLE block [N−1], a plurality of wirings connected to first output terminals of the PLEs 40 in the PLE block [N−1], a plurality of wirings connected to the first output terminals of the PLEs 40 in the PLE block [N], and a plurality of wirings connected to second output terminals of the PLEs 40 in the PLE block [N−2] are connected to a plurality of input terminals of the PLEs 40 in the PLE block [N−1] through switch circuits 60.

Specifically, in FIG. 17(A), for example, the plurality of wirings 55 connected to the first output terminals of the PLEs 40 in the PLE block 51[2], the plurality of wirings 54 connected to the first output terminals of the PLEs 40 in the PLE block 51[3], and the plurality of wirings 53 connected to the second output terminals of the PLEs 40 in the PLE block 51[1] are connected to a plurality of input terminals of the PLEs 40 in the PLE block 51[2] through the switch circuits 60.

FIG. 17(B) is a circuit diagram of the switch circuit 60 that controls an electrical connection between the plurality of wirings 53, the plurality of wirings 54, and the plurality of wirings 55 and the plurality of input terminals of the PLEs 40 in the second PLE block 51[2] illustrated in FIG. 17(A). A plurality of wirings 59 in FIG. 17(B) are connected to the plurality of input terminals of one of the PLEs 40 in the second PLE block 51[2].

The switch circuit 60 includes a plurality of switch circuits 10. FIG. 17(C) illustrates a specific structural example of the switch circuit 60 illustrated in FIG. 17(B). As illustrated in FIG. 17(C), the switch circuit 60 in FIG. 17(B) includes three switch circuits 10: a switch circuit 10[1], a switch circuit 10[2], and a switch circuit 10[3].

FIG. 17(C) illustrates the switch circuit 60 connected to three wirings 59 and thus shows the case where the switch circuit 60 includes the three switch circuits 10: the switch circuit 10[1], the switch circuit 10[2], and the switch circuit 10[3]. The number of switch circuits 10 included in the switch circuit 60 can be determined in accordance with the number of the input terminals of the PLE 40.

FIG. 17(B) and FIG. 17(C) illustrate the switch circuit 60, as a typical example, that controls the electrical connection between the pluralities of wirings 53, 54, and 55 and the plurality of wirings 59; the other switch circuits 60 that control electrical connections between a plurality of wirings and a plurality of wirings in FIG. 17(A) also have a similar structure.

FIG. 18 illustrates a more specific structural example of the switch circuit 60 in FIG. 17(C). FIG. 18 more specifically shows an electrical connection relation between the plurality of wirings 53, the plurality of wirings 54, and the plurality of wirings 55 and the switch circuit 60. As illustrated in FIG. 18, each of the switch circuits 10 controls an electrical connection between all the pluralities of wirings 53, 54, and 55 and one of the plurality of wirings 59.

Specifically, FIG. 18 illustrates an example where the plurality of wirings 53 include a wiring 53[1], a wiring 53[2], and a wiring 53[3]; the plurality of wirings 54 include a wiring 54[1], a wiring 54[2], and a wiring 54[3]; and the plurality of wirings 55 include a wiring 55[1], a wiring 55[2] and a wiring 55[3]. Furthermore, in FIG. 18, an example where the plurality of wirings 59 include a wiring 59[1], a wiring 59[2], and a wiring 59[3] is illustrated.

In FIG. 18, the switch circuit 10[1] controls an electrical connection between all the pluralities of wirings 53, 54, and 55 and the wiring 59[1]. Specifically, the switch circuit 10[1] has a function of selecting one of the pluralities of wirings 53, 54, and 55 in accordance with configuration data and electrically connecting the one selected wiring to the wiring 59[1].

Furthermore, the switch circuit 10[2] controls an electrical connection between all the pluralities of wirings 53, 54, and 55 and the wiring 59[2]. Specifically, the switch circuit 10[2] has a function of selecting one of the pluralities of wirings 53, 54, and 55 in accordance with configuration data and electrically connecting the one selected wiring to the wiring 59[2].

The switch circuit 10[3] controls an electrical connection between all the pluralities of wirings 53, 54, and 55 and the wiring 59[3]. Specifically, the switch circuit 10[3] has a function of selecting one of the pluralities of wirings 53, 54, and 55 in accordance with configuration data and electrically connecting the one selected wiring to the wiring 59[3].

As described above, one of a plurality of wirings, such as the wirings 53, 54, and 55, which are electrically connected to the output terminal of the PLE 40 is selected in accordance with configuration data, and the one selected wiring and one wiring, such as the wiring 59, which is electrically connected to the input terminal of another PLE 40 are electrically connected by the switch circuit 10. Further, the switch circuit 60 including the switch circuit 10 and the aforementioned various wirings whose electrical connections are controlled by the switch circuits 60 are provided between PLE blocks including the PLEs 40, such as the PLE block 51[1], the PLE block 51[2], and the PLE block 51[3]; thus, in the PLD 50 illustrated in FIG. 17(A), an electrical connection between one of the PLEs 40 in the PLE block 51[2] and another one of the PLEs 40 in the PLE block 51[2] can be controlled by one switch circuit 10. Further, an electrical connection between one of the PLEs 40 in the PLE block 51[1] and one of the PLEs 40 in the PLE block 51[2] can be controlled by one switch circuit 10. Moreover, an electrical connection between one of the PLEs 40 in the PLE block 51 [2] and one of the PLEs 40 in the PLE block 51[3] can be controlled by one switch circuit 10. Thus, with the combination of the layout of the PLEs 40 and the switch circuits 60 illustrated in FIG. 17 and the switch circuit 10 having the structure illustrated in FIG. 1, the PLD 50 that includes a small number of switches in a routing resource while having high design flexibility can be achieved.

<Connection between I/O Element and Programmable Logic Element>

Next, connections between I/O elements and programmable logic elements in the PLD 50 will be described. FIG. 19 illustrates an example of part of the PLD 50. In FIG. 19, the PLE block 51 including a plurality of the PLEs 40 and an I/O block 62 including a plurality of I/O elements 61 are provided in the PLD 50. FIG. 19 illustrates an example where the I/O block 62 and the PLE block 51 are positioned in parallel in this order from the left.

In the PLD 50 illustrated in FIG. 19, a plurality of wirings 63, a plurality of wirings 64, a plurality of wirings 65, a plurality of wirings 66, and a plurality of wirings 67 are provided.

The first output terminals of the PLEs 40 in the PLE block 51 are connected to the plurality of wirings 63 and the plurality of wirings 67. The second output terminals of the PLEs 40 in the PLE block 51 are connected to the plurality of wirings 64. Output terminals of the I/O elements 61 in the I/O block 62 are connected to the plurality of wirings 66. The plurality of wirings 65 are connected to the first output terminals of a plurality of the PLEs 40 (not illustrated) that are positioned on the right side of the PLE block 51 in FIG. 19.

The number of output terminals included in each I/O element 61 is not limited to one and can be more than one. Note that one output terminal is always connected to one wiring even when the number of output terminals is more than one. That is, when the number of I/O elements 61 included in the I/O block 62 is Z (Z is a natural number), the PLD 50 at least includes Z wirings 64 electrically connected to the output terminals.

The plurality of wirings 63, the plurality of wirings 65, the plurality of wirings 66, and the plurality of wirings 67 are positioned between the I/O block 62 and the PLE block 51. The PLE block 51 is positioned between the plurality of wirings 63 and the plurality of wirings 64.

In FIG. 19, the plurality of wirings 63, the plurality of wirings 65, and the plurality of wirings 66 are electrically connected to a plurality of input terminals of the PLEs 40 in the PLE block 51 through the switch circuits 60. Moreover, in FIG. 19, the plurality of wirings 67 are electrically connected to the input terminals of the I/O elements 61 in the I/O block 62 through switch circuits 68.

The switch circuit 68 includes one switch circuit 10. The switch circuit 68 included in the switch circuit 10 has functions of selecting one of the plurality of wirings 67 in accordance with configuration data and connecting the one selected wiring to the input terminal of each of the I/O elements 61.

Note that FIG. 17(A) and FIG. 19 each illustrate the example in which the PLEs 40 that belong to one PLE block are connected to each other through a plurality of wirings provided between PLE blocks including the PLEs 40; alternatively, the PLD 50 may include a wiring that directly connects the PLEs 40 belonging to one PLE block.

<Plan View of PLD>

FIG. 20 is an example of a top view of the PLD 50.

The PLD 50 in FIG. 20 includes logic arrays 70, the I/O elements 61, phase lock loops (PLLs 72), a RAM 73, and a multiplier 74.

The logic array 70 includes a plurality of PLEs 40 and a routing resource 75 that includes wirings and switches for controlling electrical connections between the PLEs 40. The PLL 72 has a function of generating the clock signal CK. The RAM 73 has a function of storing data used for logic operation. The multiplier 74 corresponds to a logic circuit dedicated to multiplication. The multiplier 74 is not necessarily provided when the logic array 70 has a function of executing multiplication.

Although FIG. 20 illustrates the case where configuration data for the PLEs 40 with which a logic circuit is determined is stored in a memory element provided outside the PLD 50, the memory element may be provided in the PLD 50.

<Structure Example of LUT>

In this embodiment, an example of the structure of the LUT 34 included in the PLE 40 will be described. The LUT 34 can be composed of a plurality of multiplexers. Configuration data can be input to any of input terminals and control terminals of the plurality of multiplexers.

FIG. 21(A) illustrates one embodiment of the LUT 34 included in the PLE 40.

In FIG. 21(A), the LUT 34 is composed of seven two-input multiplexers (a multiplexer 81, a multiplexer 82, a multiplexer 83, a multiplexer 84, a multiplexer 85, a multiplexer 86, and a multiplexer 87). Input terminals of the multiplexer 81 to the multiplexer 84 correspond to an input terminal M1 to an input terminal M8 of the LUT 34.

Control terminals of the multiplexers 81 to 84 are electrically connected to each other and correspond to an input terminal IN3 of the LUT 34. Output terminals of the multiplexers 81 and 82 are connected to two respective input terminals of the multiplexer 85. Output terminals of the multiplexers 83 and 84 are connected to two respective input terminals of the multiplexer 86. Control terminals of the multiplexers 85 and 86 are connected to each other and correspond to an input terminal IN2 of the LUT 34. Output terminals of the multiplexers 85 and 86 are connected to two respective input terminals of the multiplexer 87. A control terminal of the multiplexer 87 corresponds to an input terminal IN1 of the LUT 34. An output terminal of the multiplexer 87 corresponds to an output terminal OUT of the LUT 34.

The kind of logic operation performed by the LUT 34 can be determined in such a manner that output signals corresponding to configuration data stored in a configuration memory is input from the configuration memory to the input terminals M1 to M8.

For example, when output signals corresponding to configuration data that are stored in the configuration memory and have logical values "0", "1", "0", "1", "0", "1", "1", and "1" are input from the configuration memory to the input terminals M1 to M8 of the LUT 34 in FIG. 21(A), the function of an equivalent circuit illustrated in FIG. 21(C) can be obtained.

FIG. 21(B) illustrates another embodiment of the LUT 34 included in the PLE 40. In FIG. 21(B), the LUT 34 is composed of three two-input multiplexers (a multiplexer 91, a multiplexer 92, and a multiplexer 93) and a two-input OR gate 94.

Output terminals of the multiplexers 91 and 92 are connected to two respective input terminals of the multiplexer 93. An output terminal of the OR gate 94 is connected to a control terminal of the multiplexer 93. An output terminal of the multiplexer 93 corresponds to the output terminal OUT of the LUT 34.

The kind of logic operation performed by the LUT 34 can be determined when an output signal corresponding to configuration data stored in a configuration memory is input from the configuration memory to any of a control terminal A1 and input terminals A2 and A3 of the multiplexer 91, a control terminal A6 and input terminals A4 and A5 of the multiplexer 92, and input terminals A7 and A8 of the OR gate 94.

For example, when output signals corresponding to configuration data that are stored in the configuration memory and have logical values "0", "1", "0", "0", and "0" are input from the configuration memory to the input terminal A2, the input terminal A4, the input terminal A5, the control terminal A6, and the input terminal A8 of the LUT 34 in FIG. 21(B), the function of the equivalent circuit illustrated in FIG. 21(C) can be obtained. In the above structure, the control terminal A1, the input terminal A3, and the input terminal A7 correspond to the input terminal IN1, the input terminal IN2, and the input terminal IN3, respectively.

Note that FIG. 21(A) and FIG. 21(B) illustrate examples of the LUT 34 composed of two-input multiplexers; alternatively, the LUT 34 may be composed of multiplexers with three or more inputs.

The LUT 34 may also include any or all of a diode, a resistor, a logic circuit, and a switch in addition to the multiplexers. As the logic circuit, a buffer, an inverter, a NAND circuit, a NOR circuit, a three-state buffer, a clocked inverter, or the like can be used. As the switch, an analog switch or a transistor can be used, for example.

The case illustrated in FIG. 21(C) in which three-input one-output logic operation is performed with the LUT 34 in FIG. 21(A) or FIG. 21(B) is described here; however, one embodiment of the present disclosure is not limited thereto.

By appropriately determining the LUT 34 and configuration data to be input, logic operation with more inputs and more outputs can be performed.

<Example of Cross-Sectional Structure of Semiconductor Device>

FIG. 22 illustrates an example of a cross-sectional structure of the transistor 11*t*, the transistor 12*t*, and the capacitor 19 included in the programmable switch 20*a* illustrated in FIG. 3(B). In FIG. 22, an example in which the transistor 11*t* including a channel formation region in an oxide semiconductor film and the capacitor 19 are formed over the transistor 12*t* including a channel formation region in a single crystal silicon substrate, is illustrated.

Note that the transistor 13*t* of the programmable switch 20*b* illustrated in FIG. 3(C) can be formed through the same manufacturing process as the transistor 12*t*. The same can apply to the transistor 13*t* and the like of the programmable switch 20 illustrated in FIG. 9(A) or FIG. 9(B).

Note that an active layer in the transistor 12*t* can be an amorphous, microcrystalline, polycrystalline, or signal crystal semiconductor film of silicon, germanium, or the like. Alternatively, the active layer in the transistor 12*t* may be formed using an oxide semiconductor. In the case where an oxide semiconductor is used for active layers of all the transistors, the transistor 11*t* is not necessarily stacked over the transistor 12*t*, and the transistors 11*t* and 12*t* may be formed in the same layer.

In the case where the transistor 12*t* is formed using a silicon thin film, any of the following can be used, for example: amorphous silicon formed by sputtering or vapor deposition such as plasma CVD, polycrystalline silicon obtained by crystallization of amorphous silicon by laser annealing or the like, and single crystal silicon obtained in such a manner that a surface portion of a single crystal silicon wafer is separated after implantation of hydrogen ions or the like into the silicon wafer.

Examples of a semiconductor substrate 200 where the transistor 12*t* is formed are an n-type or p-type silicon substrate, germanium substrate, silicon germanium substrate, and compound semiconductor substrate (e.g., GaAs substrate, InP substrate, GaN substrate, SiC substrate, GaP substrate, GaInAsP substrate, and ZnSe substrate).

The transistor 12*t* is electrically isolated from other transistors by an element isolation insulating film 201. The element isolation insulating film 201 can be formed by a local oxidation of silicon (LOCOS) method, a trench isolation method, or the like.

Specifically, the transistor 12*t* includes an impurity region 202 and an impurity region 203 that are formed in the semiconductor substrate 200 and function as a source region and a drain region, a gate electrode 204, and a gate insulating film 205 provided between the semiconductor substrate 200 and the gate electrode 204. The gate electrode 204 overlaps with a channel formation region formed between the impurity region 202 and the impurity region 203, with the gate insulating film 205 placed between the gate electrode 204 and the channel formation region.

An insulating film 209 is provided over the transistor 12*t*. Openings are formed in the insulating film 209. A contact plug 210 in contact with the impurity region 202, a contact plug 211 in contact with the impurity region 203, and a contact plug 212 electrically connected to the gate electrode 204 are formed in the openings.

The contact plug 210 is electrically connected to a wiring 215 formed over the insulating film 209. The contact plug 211 is electrically connected to a wiring 216 formed over the insulating film 209. The contact plug 212 is electrically connected to a wiring 217 formed over the insulating film 209.

An insulating film 220 and an insulating film 240 are formed to be stacked in this order over the wirings 215 to 217. An opening is formed in the insulating films 220 and 240. A contact plug 221 electrically connected to the wiring 217 is formed in the opening.

The transistor 11*t* includes, over the insulating film 240, a semiconductor film 230 containing an oxide semiconductor, conductive films 232 and 233 that are positioned over the semiconductor film 230 and function as a source electrode and a drain electrode, a gate insulating film 231 over the semiconductor film 230 and the conductive films 232 and 233, and a gate electrode 234 that is positioned over the gate insulating film 231 and overlaps with the semiconductor film 230 between the conductive films 232 and 233. Note that the conductive film 233 is electrically connected to the contact plug 221.

A conductive film 235 is provided over the gate insulating film 231 to overlap with the conductive film 233. A portion where the conductive film 235 overlaps with the conductive film 233 with the gate insulating film 231 placed therebetween functions as the capacitor 19.

Note that the case where the capacitor 19, together with the transistor 11*t*, is provided over the insulating film 240 is illustrated in FIG. 22 as an example; alternatively, the capacitor 19 may be provided below the insulating film 240 together with the transistor 12*t*.

An insulating film 241 and an insulating film 242 are formed to be stacked in this order over the transistor 11*t* and the capacitor 19. An opening is formed in the insulating films 241 and 242. A conductive film 243 that is in contact with the gate electrode 234 in the opening is provided over the insulating film 241.

In FIG. 22, the transistor 11*t* includes the gate electrode 234 on at least one side of the semiconductor film 230. Alternatively, the transistor 11*t* may include a pair of gate electrodes with the semiconductor film 230 placed therebetween.

In the case where the transistor 11*t* has a pair of gate electrodes with the semiconductor film 230 therebetween, one of the gate electrodes may be supplied with a signal for controlling the conducting/non-conducting state, and the other of the gate electrodes may be supplied with a potential from a different place. In this case, potentials with the same level may be supplied to the pair of gate electrodes, or a fixed potential such as the ground potential may be supplied only to the other of the gate electrodes. By controlling the level of a potential supplied to the other of the gate electrodes, the threshold voltage of the transistor can be controlled.

Furthermore, in FIG. 22, an example in which the transistor 11*t* has a single-channel structure where one channel formation region corresponding to one gate electrode 234 is illustrated. However, when a plurality of gate electrodes electrically connected to each other are provided in the transistor 11*t*, the transistor 11*t* can have a multi-channel structure where a plurality of channel formation regions are included in one active layer.

FIG. 23 illustrates another structure example. In FIG. 23, the cross section A1-A2 shows the transistors 11*t* and 12*t* in the channel length direction (the direction from the source to the drain), and the cross section A3-A4 shows the transistors 11*t* and 12*t* in the channel width direction (the direction perpendicular to the channel length direction). Note that in the layout, the channel length direction of the transistor 11*t* does not necessarily agree with that of the transistor 12*t*.

The transistor 12*t* is electrically isolated from other semiconductor elements by an element isolation method. An example of the element isolation method is a trench isolation method (shallow trench isolation: STI). FIG. 23 illustrates an example where the trench isolation method is used to electrically isolate the transistor 12t. Specifically, illustrated is an example in which the transistor 12t is electrically isolated by using an element isolation insulating film 251 that is formed in such a manner that an insulator containing silicon oxide or the like is buried in a trench formed in the semiconductor substrate 250 by etching or the like and then the insulator is removed partly by etching or the like.

In a projection of the semiconductor substrate 250 that exists in a region other than the trench, an impurity region 252 and an impurity region 253 of the transistor 12t and a channel formation region 254 placed between the impurity regions 252 and 253 are provided. The transistor 12t also includes an insulating film 255 covering the channel formation region 254 and a gate electrode 256 that overlaps the channel formation region 254 with the insulating film 255 placed therebetween.

In the transistor 12t, a side portion and an upper portion of the projection in the channel formation region 254 overlap with the gate electrode 256 with the insulating film 255 positioned therebetween, so that carriers flow in a wide area including a side portion and an upper portion of the channel formation region 254. Thus, the number of transferred carriers in the transistor 12t can be increased while an area over the substrate occupied by the transistor 12t is reduced. As a result, on-state current is increased in the transistor 12t. Suppose the length of the projection of the channel formation region 254 in the channel width direction (i.e., channel width) is W and the thickness of the projection of the channel formation region 254 is T. When the aspect ratio that corresponds to the ratio of the thickness T to the channel width W is high, a region where carrier flows becomes wider. Thus, the on-state current of the transistor 12t can be further increased.

Note that when the transistor 12t is formed using a bulk semiconductor substrate, the aspect ratio is preferably 2 or more, further preferably 5 or more.

An insulating film 261 is provided over the transistor 12t. Openings are formed in the insulating film 261. A contact plug 262, a contact plug 263, and a contact plug 264 that are electrically connected to the impurity region 252, the impurity region 253, and the gate electrode 256, respectively, are formed in the openings. The contact plug 262 is electrically connected to a wiring 266 over the insulating film 261. The contact plug 263 is electrically connected to a wiring 267 over the insulating film 261. The contact plug 264 is electrically connected to a wiring 268 over the insulating film 261.

An insulating film 270 is provided over the wiring 266 to the wiring 268. An insulating film 271 having an effect of blocking diffusion of oxygen, hydrogen, and water is provided over the insulating film 270. An insulating film 272 is provided over the insulating film 271. The transistor 11t is provided over the insulating film 272.

As the insulating film 271 has higher density and becomes denser or has a fewer dangling bonds and becomes more chemically stable, the insulating film 271 has a higher blocking effect. The insulating film 271 having an effect of blocking diffusion of oxygen, hydrogen, and water can be formed using, for example, aluminum oxide, aluminum oxynitride, gallium oxide, gallium oxynitride, yttrium oxide, yttrium oxynitride, hafnium oxide, or hafnium oxynitride. The insulating film 271 having an effect of blocking diffusion of hydrogen and water can be formed using silicon nitride or silicon nitride oxide, for example.

The transistor 11t includes a semiconductor film 280, conductive films 282 and 283 in contact with the semiconductor film 280, an insulating film 281 covering the semiconductor film 280, and a gate electrode 284 that overlaps the semiconductor film 280 with the insulating film 281 placed therebetween. The conductive films 282 and 283 function as source and drain electrodes. The conductive film 283 is connected to the wiring 268 in an opening formed in the insulating films 270 to 272.

An insulating film may be provided over the transistor 11t. It is possible that an opening is formed in the insulating film and a wiring that is in contact with the gate electrode 284 in the opening is provided over the insulating film.

Note that in FIG. 23, the transistor 11t includes the gate electrode 284 on at least one side of the semiconductor film 280; alternatively, the transistor 11t may also include a gate electrode that overlaps the semiconductor film 280 with the insulating film 272 placed therebetween.

When the transistor 11t includes a pair of gate electrodes, one of the gate electrodes may be supplied with a signal for controlling the on/off state, and the other of the gate electrodes may be supplied with another potential independently. In this case, potentials with the same level may be supplied to the pair of gate electrodes, or a fixed potential such as the ground potential may be supplied only to the other of the gate electrodes. By controlling the level of a potential supplied to the other of the gate electrodes, the threshold voltage of the transistor can be controlled.

In FIG. 23, the transistor 11t has a single-gate structure where one channel formation region corresponding to one gate electrode 284 is provided. When a plurality of gate electrodes electrically connected to each other are provided in the transistor 11t, for example, the transistor 11t can have a multi-gate structure where a plurality of channel formation regions are included in one semiconductor film.

In the transistor 11t in FIG. 23, the semiconductor film 280 has a three-layer structure including semiconductor films 280a to 280c. The conductive films 282 and 283 are formed after formation of the semiconductor films 280a and 280b, and the semiconductor film 280c is subsequently formed. However, it is possible that the transistor 11t does not include any one or two of the semiconductor films 280a to 280c.

<Structure of Chip>

FIG. 24(A) is a perspective view illustrating a structure of a package using a lead frame interposer. In the package illustrated in FIG. 24(A), a chip 302 corresponding to the semiconductor device is connected to a terminal 303 over an interposer 301 by a wire bonding method. The terminal 303 is placed on a surface of the interposer 301 on which the chip 302 is mounted. The chip 302 may be sealed by a mold resin 304 in which case the chip 302 is sealed so that part of each of the terminals 303 is exposed.

FIG. 24(B) illustrates the structure of a module of an electronic device in which the package is mounted on a circuit board. In the module of a mobile phone illustrated in FIG. 24(B), a package 313 and a battery 315 are mounted on a printed wiring board 312. In addition, the printed wiring board 312 is mounted on a panel 311 including a display element, by an FPC 314.

<System>

FIG. 25 illustrates a structural example of a system including the above-described semiconductor device. A system 320 illustrated in FIG. 25 includes one or more components 321 and a command unit 322 which controls power supply to the components 321 individually. The above-described semiconductor device can be used in the command unit 322.

The component 321 includes a power supply line 323, a load 324 which consumes power, and a switch 325 which switches electrical connection between the power supply line 323 and the load 324. When the switch 325 is on (in a conducting state), power is supplied from the power supply line 323 to the load 324 through the switch 325. When the switch 325 is off (in a non-conducting state), power supply from the power supply line 323 to the load 324 is stopped.

The command unit 322 has a function of separately controlling the on/off state of the switch 325 included in each of the components 321. The on/off selection of the switch 325 in each of the components 321 can be conducted at a command input to the command unit 322 from the outside of the system 320.

Note that in the case where the load included in one component and the load included in another component operate by interacting with each other, such a configuration as to conduct on/off control of the switches 325 all at once by the command unit 322 may be employed. Thus, the system of this embodiment can be driven in such a manner that in appearance, power is supplied to components necessary for achieving a certain purpose only for a period necessary for the operation, and the components operate in conjunction with each other in succession over time.

Alternatively, the system 320 may include an ammeter for monitoring the power consumption in the load 324 or the like so that the command unit 322 can judge the necessity of power supply to the load 324 based on the amount of power in the load 324. For example, in the case where the power consumption in the load 324 is approximately the same as the leak power consumed by the load 324 in the standby mode over a certain period, the command unit 322 can judge that the power supply to the load 324 is unnecessary.

Alternatively, the system 320 may include a sensor circuit so that the usage environment and/or the ambient environment of the load 324 can be monitored using physical values of light, sound, temperature, magnetism, pressure, or the like sensed by the sensor circuit, and the command unit 322 can judge the necessity of power supply to the load 324 based on a change sensed by the monitoring. In this case, the command unit 322 selects on or off of the switch 325 based on results of the judgment on the necessity of power supply.

For example, the system 320 is attached to a house. Here, household electrical appliances provided in the house such as a lighting device, an electric heater, and an air cleaner correspond to the components. In this case, using a sensor circuit having an optical sensor, the brightness of the room where the lighting device is used is monitored. When the room becomes brighter than a prescribed value by a change in the amount of light streaming through the window, the command unit 322 can turn off the switch 325 of the lighting device to stop power supply to the lighting device.

Further, using a sensor circuit having a temperature sensor, specifically, the temperature of the room where the electric heater is used is monitored. When the temperature of the room becomes higher than a prescribed value by a change in the outside air temperature, the command unit 322 can turn off the switch 325 of the electric heater to stop power supply to the electric heater.

Further, using a sensor circuit 326 having an optical sensor, the usage status of the room where the air cleaner is used is monitored. When human motion is not detected for a certain period by the sensor circuit 326, the command unit 322 can turn off the switch 325 of the air cleaner to stop power supply to the air cleaner.

Note that in the case where the above-described household electrical appliances correspond to the components, the switches 325 are incorporated in the respective household electrical appliances. In the case where the switches 325 are provided outside the household electrical appliances, the household electrical appliances correspond to the loads 324, and the components each include the switch 325 and the household electrical appliance corresponding to the load 324.

In the case where the components are provided independently, on/off selection of the switches 325 by the command unit 322 is conducted using wireless signals. In this case, the switch 325, as a nonvolatile switch, is preferably configured to hold a signal for changing the switch state from the command unit 322.

The sensor circuit 326 includes the sensor and a circuit group for processing sensor signals output from the sensor. A temperature sensor, a magnetic sensor, an optical sensor, a microphone, a strain gauge, a pressure sensor, a gas sensor, or the like can be used as the sensor. The temperature sensor may be a contact sensor such as a resistance temperature sensor, a thermistor, a thermocouple, or an IC temperature sensor, or a non-contact sensor such as a thermal type infrared ray sensor or a quantum type infrared ray sensor.

In the case where the components are provided independently, sensor circuits may be provided in the respective components and data obtained by the sensor circuits may be transmitted to the command unit 322 using wireless signals. As illustrated in FIG. 25, the sensor circuits 326 are provided for the respective components and separately transmit data concerning physical values to the command unit 322. The command unit 322 monitors the physical values sensed by the sensor circuits 326 provided in the respective components and judges the necessity of power supply to the loads 324.

The sensor circuit 326 transmits data concerning physical values to the command unit 322. The command unit 322 monitors the physical values sensed by the sensor circuit 326 and judges the necessity of power supply to the loads 324. For example, in the case where the temperature in one component is determined to be higher than or equal to a predetermined value by the sensor circuit 326, power supply to the load 324 such as a speaker, which produces sound, included in another component can be started. With this structure, the system 320 can serve as an alarm system.

Note that the components may be electronic devices such as a computer, a detector, and a television; devices included in a computer system (a CPU, a memory, a HDD, a printer, a monitor); or electricity-controlled devices incorporated in a car. Alternatively, the components may be internal parts of an LSI such as a CPU or a semiconductor memory. Here, the computer refers to not only a tablet computer, a notebook computer, and a desktop computer, but also a large computer such as a server system.

The concept of the components can be applied to a wide ranging concept of social infrastructure, houses, and the like which require systems, as well as electronic devices that operate with supplied power.

Here, specific examples of the object to which the above-described system is applied in the case of application to a wide ranging concept of social infrastructure and the like are described. For example, in the case of applying the above-described system to social infrastructure, a railroad, a harbor, a road, and the like can be given as the components illustrated in FIG. 25, and a substation, a power plant, and the like can be given as the command unit. As another example, sections such as rooms or stories of a building can be given as the components illustrated in FIG. 25, and a power management facility, a switchboard, and the like can be given as the command unit.

<Examples of Electronic Device>

The above-described circuit, programmable switch, PLE, PLD, and the like can be used for display devices, personal computers, and image reproducing devices provided with recording media (typically, devices that reproduce the content of recording media such as digital versatile discs (DVDs) and have displays for displaying the reproduced images). Other examples of electronic devices that can use the above-described circuit, programmable switch, PLE, PLD, and the like are mobile phones, game consoles including portable game consoles, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIG. 26 illustrates specific examples of these electronic devices.

Figure 26A:
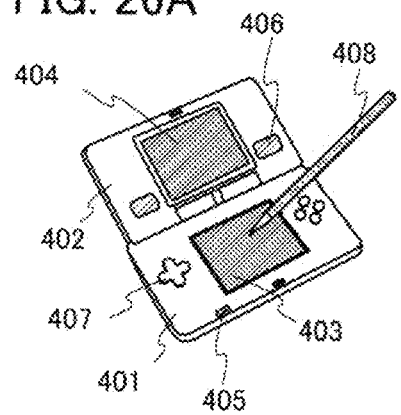

FIG. 26(A) illustrates a portable game console including a housing 401, a housing 402, a display portion 403, a display portion 404, a microphone 405, a speaker 406, an operation key 407, a stylus 408, and the like. Note that although the portable game console illustrated in FIG. 26(A) has the two display portions 403 and 404, the number of display portions included in the portable game console is not limited to two.

Figure 26B:
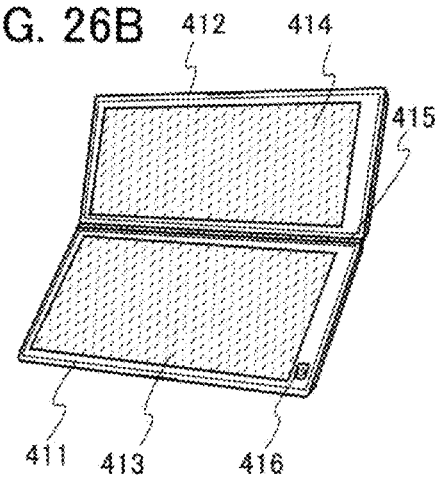

FIG. 26(B) illustrates a portable information terminal including a first housing 411, a second housing 412, a first display portion 413, a second display portion 414, a joint 415, an operation key 416, and the like. The first display portion 413 is provided in the first housing 411, and the second display portion 414 is provided in the second housing 412. The first housing 411 and the second housing 412 are connected to each other with the joint 415, and the angle between the first housing 411 and the second housing 412 can be changed with the joint 415. Images on the first display portion 413 may be switched in accordance with the angle at the joint 415 between the first housing 411 and the second housing 412. A display device with a function of a position input device may be used as at least one of the first display portion 413 and the second display portion 414. Note that the function of the position input device can be added by provision of a touch panel in a display device. Alternatively, the function of the position input device can be added by provision of a photoelectric conversion element called a photosensor in a pixel area of a display device.

Figure 26C:
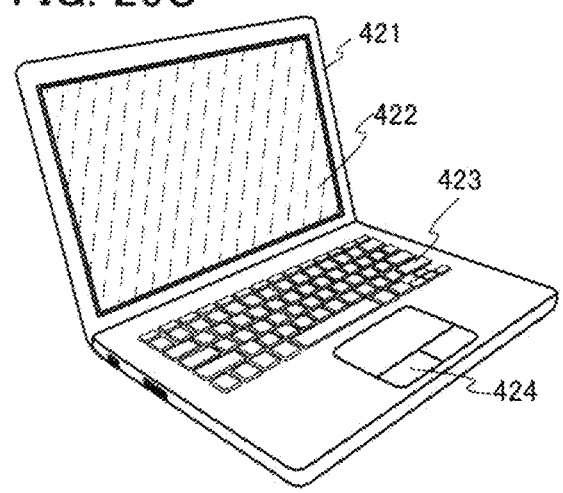

FIG. 26(C) illustrates a notebook personal computer including a housing 421, a display portion 422, a keyboard 423, a pointing device 424, and the like.

Figure 26D:
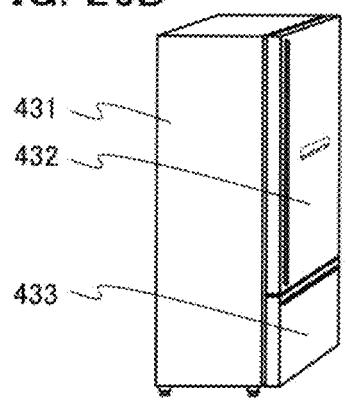

FIG. 26(D) illustrates an electric refrigerator-freezer including a housing 431, a refrigerator door 432, a freezer door 433, and the like.

Figure 26E:
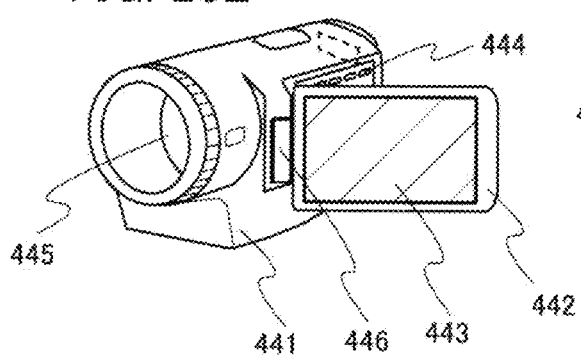

FIG. 26(E) illustrates a video camera including a first housing 441, a second housing 442, a display portion 443, operation keys 444, a lens 445, a joint 446, and the like. The operation keys 444 and the lens 445 are provided in the first housing 441, and the display portion 443 is provided in the second housing 442. The first housing 441 and the second housing 442 are connected to each other with the joint 446, and the angle between the first housing 441 and the second housing 442 can be changed with the joint 446. Images displayed on the display portion 443 may be switched in accordance with the angle at the joint 446 between the first housing 441 and the second housing 442.

Figure 26F:
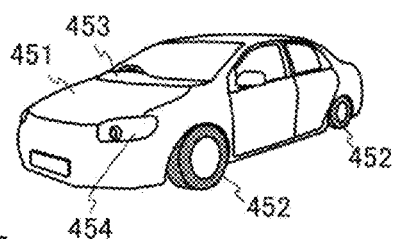

FIG. 26(F) illustrates a passenger car including a car body 451, wheels 452, a dashboard 453, lights 454, and the like.

This application is based on Japanese Patent Application serial no. 2014-038589 filed with Japan Patent Office on Feb. 28, 2014 and Japanese Patent Application serial no. 2014-038592 filed with Japan Patent Office on Feb. 28, 2014, the entire contents of which are hereby incorporated by reference.

REFERENCE NUMERALS

A1 control terminal
A2 input terminal
A3 input terminal
A4 input terminal
A5 input terminal
A6 control terminal
A7 input terminal
A8 input terminal
IN1 input terminal
IN2 input terminal
IN3 input terminal
M1 input terminal
M2 input terminal
M3 input terminal
M4 input terminal
M5 input terminal
M6 input terminal
M7 input terminal
M8 input terminal
OUT output terminal
10 switch circuit
10a switch circuit
10b switch circuit
10c switch circuit
10d switch circuit
10e switch circuit
10f switch circuit
10g switch circuit
10h switch circuit
10i switch circuit
11 switch
11t transistor
11tb transistor
12 switch
12t transistor
13 switch
13t transistor
13tn n-channel transistor
13tp p-channel transistor
14 wiring
15 wiring
16 wiring
17 wiring
18 switch
19 capacitor
19tn n-channel transistor
19tp p-channel transistor
20 programmable switch
20a programmable switch
20b programmable switch
20c programmable switch
21 programmable switch block
22 switch
22t transistor
23 latch
24 wiring
24L low-potential wiring
24H high-potential wiring
25 inverter
26 transistor
27a driver circuit
27b driver circuit
28 selection circuit
29 sample-and-hold circuit
30 switch 31 programmable switch
32 programmable switch block
34 LUT
35 flip-flop
36 configuration memory
37 input terminal
38 switch
39 output terminal
40 PLE
40a PLE
40b PLE
40c PLE
41 AND gate
42 multiplexer
43 configuration memory
50 PLD
51 PLE block
52 wiring
53 wiring
54 wiring
55 wiring
56 wiring
57 wiring
58 wiring
59 wiring
60 switch circuit
61 I/O element
62 I/O block
63 wiring
64 wiring
65 wiring
66 wiring
67 wiring
68 switch circuit
70 logic array
72 PLL
73 RAM
74 multiplier
75 routing resource
81 multiplexer
82 multiplexer
83 multiplexer
84 multiplexer
85 multiplexer
86 multiplexer
87 multiplexer
91 multiplexer
92 multiplexer
93 multiplexer
94 OR gate
200 semiconductor substrate
201 element isolation insulating film
202 impurity region
203 impurity region
204 gate electrode
205 gate insulating film
209 insulating film
210 contact plug
211 contact plug
212 contact plug
215 wiring
216 wiring
217 wiring
220 insulating film
221 contact plug
230 semiconductor film
231 gate insulating film
232 conductive film
233 conductive film
234 gate electrode
235 conductive film
240 insulating film
241 insulating film
242 insulating film
243 conductive film
250 semiconductor substrate
251 element isolation insulating film
252 impurity region
253 impurity region
254 channel formation region
255 insulating film
256 gate electrode
261 insulating film
262 contact plug
263 contact plug
264 contact plug
266 wiring
267 wiring
268 wiring
270 insulating film
271 insulating film
272 insulating film
280 semiconductor film
280a semiconductor film
280b semiconductor film
280c semiconductor film
281 insulating film
282 conductive film
283 conductive film
284 gate electrode
301 interposer
302 chip
303 terminal
304 mold resin
311 panel
312 printed wiring board
313 package
314 FPC
315 battery
320 system
321 component
322 command unit
323 power supply line
324 load
325 switch
326 sensor circuit
401 housing
402 housing
403 display portion
404 display portion
405 microphone
406 speaker
407 operation key
408 stylus
411 housing
412 housing
413 display portion
414 display portion
415 joint
416 operation key
421 housing
422 display portion
423 keyboard
424 pointing device 431 housing
432 refrigerator door
433 freezer door
441 housing
442 housing
443 display portion
444 operation key
445 lens
446 joint
451 car body
452 wheel
453 dashboard
454 light

The invention claimed is:

1. A semiconductor device characterized by comprising:
a first wiring;
a second wiring;
a third wiring;
a fourth wiring;
a first switch;
a second switch;
a third switch; and
a fourth switch,
wherein the first switch has a function of controlling conduction between the first wiring and a control terminal of the second switch,
wherein the second switch has a function of controlling conduction between the second wiring and the fourth wiring,
wherein the third switch has a function of controlling conduction between the second wiring and a control terminal of the fourth switch,
wherein the fourth switch has a function of controlling conduction between the third wiring and the fourth wiring,
wherein a first signal is supplied to the first wiring and the second wiring in a first period,
wherein a second signal is supplied to the second wiring and the third wiring in a second period,
wherein the third wiring and the fourth wiring are held at a constant potential determined independent of the first signal in the first period,
wherein the first switch and the third switch are in an on state in the first period, and
wherein the first switch and the third switch are in an off state in the second period.

2. The semiconductor device according to claim 1, characterized in that:
the first signal includes configuration data,
the second signal includes data for arithmetic processing,
the first signal is a high level potential and a low level potential, and
the constant potential is the low level potential.

3. The semiconductor device according to claim 2, characterized in that:
the second switch is a first transistor,
the semiconductor device further includes a second transistor having a conductivity type opposite to a conductivity type of the first transistor,
a gate of the second transistor is directly or indirectly connected to a gate of the first transistor, and
at least one of a source and a drain of the second transistor is held at the high level potential or a potential equivalent to the high level potential in the first period and the second period.

4. The semiconductor device according to claim 2, characterized in that:
the second switch is a first transistor,
the semiconductor device further includes a third transistor having the same conductivity type as the first transistor has,
at least one of a source and a drain of the third transistor is directly or indirectly connected to a gate of the first transistor, and
a gate of the third transistor is held at the high level potential or a potential equivalent to the high level potential in the first period and the second period.

5. The semiconductor device according to claim 1,
wherein the first switch and the third switch are transistors including an oxide semiconductor film including a channel formation region.

6. The semiconductor device according to claim 5,
wherein the oxide semiconductor film includes In, Ga, and Zn.

7. The semiconductor device according to claim 1, characterized in that:
conduction between the second wiring and the fourth wiring is controlled by the second switch and a fifth switch, and
conduction between the third wiring and the fourth wiring is controlled by the fourth switch and a sixth switch.

8. The semiconductor device according to claim 1, characterized in that:
the first signal is supplied to the third wiring in the first period.

9. A semiconductor device characterized by comprising:
a plurality of first programmable logic elements;
a second programmable logic element;
a plurality of first wirings;
a second wiring; and
a plurality of circuits corresponding to the respective plurality of first wirings,
wherein a first signal is supplied to each of the plurality of first wirings in a first period,
wherein each of the plurality of first wirings is electrically connected to corresponding one of output terminals of the plurality of first programmable logic elements in a second period,
wherein the second wiring is electrically connected to an input terminal of the second programmable logic element,
wherein the plurality of circuits each includes at least a first switch, a second switch, and a third switch,
wherein the third switch has a function of controlling conduction between one of the plurality of first wirings and one terminal of the second switch,
wherein the second switch has a function of being selected to be in a conducting state or a non-conducting state depending on the first signal supplied from one of the plurality of first wirings through the first switch,
wherein the second switch has a function of controlling conduction between the second wiring and one terminal of the third switch,
wherein in the first period, the second wiring is held at a constant potential independent of the first signal and the third switch is in an off state, and
wherein in the second period, the first switch is in an off state and the third switch is in an on state.

10. The semiconductor device according to claim 9, characterized in that:
the first signal includes configuration data and is a high level potential and a low level potential, and
the constant potential is the low level potential.

11. The semiconductor device according to claim 10, characterized in that:
- the second switch is a first transistor,
- the semiconductor device further includes a second transistor,
- the second transistor has a conductivity type opposite to a conductivity type of the first transistor,
- a gate of the second transistor is electrically connected to a gate of the first transistor, and
- at least one of a source and a drain of the second transistor is held at the high level potential or a potential equivalent to the high level potential in the first period and the second period.

12. The semiconductor device according to claim 10, characterized in that:
- the second switch is a first transistor,
- the semiconductor device further includes a third transistor,
- the third transistor has the same conductivity type as the first transistor has,
- at least one of a source and a drain of the third transistor is electrically connected to a gate of the first transistor, and
- a gate of the third transistor is held at the high level potential or a potential equivalent to the high level potential in the first period and the second period.

13. The semiconductor device according to claim 9,
wherein the first switch is a transistor including an oxide semiconductor film including a channel formation region.

14. The semiconductor device according to claim 13,
wherein the oxide semiconductor film includes In, Ga, and Zn.

* * * * *